(12) United States Patent
Miyakoshi

(10) Patent No.: US 10,714,346 B2
(45) Date of Patent: Jul. 14, 2020

(54) METHOD OF MANUFACTURING SEMICONDUCTOR DEVICE

(71) Applicant: SHINDENGEN ELECTRIC MANUFACTURING CO., LTD., Chiyoda-ku, Tokyo (JP)

(72) Inventor: Nobuki Miyakoshi, Saitama (JP)

(73) Assignee: SHINDENGEN ELECTRIC MANUFACTURING CO., LTD., Tokyo (JP)

(*) Notice: Subject to any disclaimer, the term of this patent is extended or adjusted under 35 U.S.C. 154(b) by 0 days.

(21) Appl. No.: 16/463,356

(22) PCT Filed: Jan. 24, 2017

(86) PCT No.: PCT/JP2017/002243
§ 371 (c)(1),
(2) Date: May 22, 2019

(87) PCT Pub. No.: WO2018/138756
PCT Pub. Date: Aug. 2, 2018

(65) Prior Publication Data
US 2019/0355582 A1 Nov. 21, 2019

(51) Int. Cl.
*H01L 21/263* (2006.01)
*H01L 21/324* (2006.01)
*H01L 29/40* (2006.01)
*H01L 29/66* (2006.01)
*H01L 29/78* (2006.01)

(52) U.S. Cl.
CPC .......... *H01L 21/263* (2013.01); *H01L 21/324* (2013.01); *H01L 29/401* (2013.01); *H01L 29/66333* (2013.01); *H01L 29/66348* (2013.01); *H01L 29/66712* (2013.01);
(Continued)

(58) Field of Classification Search
CPC ... H01L 21/263; H01L 21/324; H01L 29/401; H01L 29/86333; H01L 29/66348; H01L 29/66712; H01L 29/66734; H01L 29/7802; H01L 29/7812
See application file for complete search history.

(56) References Cited

FOREIGN PATENT DOCUMENTS

JP 2012-69861 A 4/2012

OTHER PUBLICATIONS

International Search Report in PCT/JP2017/002243, dated Mar. 14, 2017, 2pp.

(Continued)

*Primary Examiner* — Matthew L Reames
(74) *Attorney, Agent, or Firm* — Hauptman Ham, LLP

(57) ABSTRACT

A method of manufacturing a semiconductor device includes in a following order: a first forming step where a gate electrode is formed on a first main surface side of a semiconductor base substrate with a gate insulation film interposed therebetween and, thereafter, an interlayer insulation film is formed to cover the gate electrode; a second forming step where a metal layer in a state of being connected with the gate electrode is formed over the interlayer insulation film; an irradiating step where a lattice defect is formed inside the semiconductor base substrate by irradiating an electron beam to the semiconductor base substrate in a state where the metal layer is set to a ground potential; a dividing step where the metal layer is divided into a plurality of electrodes; and an annealing step where the lattice defect in the semiconductor base substrate is repaired by heating the semiconductor base substrate.

8 Claims, 16 Drawing Sheets

(52) U.S. Cl.
CPC .... *H01L 29/66734* (2013.01); *H01L 29/7802* (2013.01); *H01L 29/7813* (2013.01)

(56) References Cited

OTHER PUBLICATIONS

Search Report in NL Application No. 2020249, dated Oct. 11, 2018, 9pp.

METHOD OF MANUFACTURING SEMICONDUCTOR DEVICE

RELATED APPLICATIONS

The present application is a National Phase of International Application Number PCT/JP2017/002243, filed Jan. 24, 2017.

TECHNICAL FIELD

The present invention relates to a method of manufacturing a semiconductor device.

BACKGROUND ART

Conventionally, there has been known a method of manufacturing a semiconductor device which includes a step where lattice defects are introduced into the inside of a semiconductor base substrate by irradiating an electron beam to the semiconductor base substrate (see patent literature 1, for example).

As shown in FIG. 17, the conventional method of manufacturing a semiconductor device includes: an MOS structure forming step; a surface metal layer forming step; a patterning step; an electron beam irradiating step; and an annealing step in this order. That is, the conventional method of manufacturing a semiconductor device includes: the MOS structure forming step (see FIG. 18A and FIG. 18B) where a gate electrode 924 is formed on a first main surface side of a semiconductor base substrate 910 with a gate insulation film 922 interposed therebetween and, thereafter, an interlayer insulation film 926 is formed so as to cover the gate electrode 924; the surface metal layer forming step (see FIG. 19A and FIG. 19B) where a surface metal layer 928' is formed over the interlayer insulation film 926; the patterning step (see FIG. 20A and FIG. 20B) where the surface metal layer 928' is patterned; the electron beam irradiating step (see FIG. 21A and FIG. 21B) where lattice defects are formed in the inside of the semiconductor base substrate 910 by irradiating an electron beam to the semiconductor base substrate 910; and the annealing step (not shown in the drawing) where the lattice defects in the semiconductor base substrate 910 are repaired by heating the semiconductor base substrate 910 in this order. In the electron beam irradiating step in the conventional method of manufacturing a semiconductor device, an electron beam is irradiated to the semiconductor base substrate 910 from a second main surface side of the semiconductor base substrate 910.

In this specification, "lattice defects are repaired" in the annealing step does not mean that the all lattice defects are repaired, but means that a predetermined number of lattice defects necessary for properly controlling a lifetime of a carrier at the time of turning off a parasitic built-in diode are made to remain and other lattice defects are repaired.

In the conventional method of manufacturing a semiconductor device, in the electron beam irradiating step, the lattice defects are formed in the inside of the semiconductor base substrate 910. Accordingly, a lifetime of a carrier at the time of turning off the parasitic built-in diode is properly controlled and hence, it is possible to manufacture a semiconductor device where a parasitic built-in diode recovery loss is small.

CITATION LIST

Patent Literature

PTL 1: JP-A-2012-69861

SUMMARY OF INVENTION

Technical Problem

However, in the conventional method of manufacturing a semiconductor device, there may be a case where a charge is generated in the gate insulation film 922 in the course of performing the electron beam irradiating step so that the gate insulation film 922 is charged. Accordingly, there exists a drawback that a case arises where a threshold voltage $V_{TH}$ of a manufactured semiconductor device becomes low. It is considered that this problem arises not only in a case where an electron beam is irradiated to the semiconductor base substrate 910 from the second main surface side but also in a case where an electron beam is irradiated to the semiconductor base substrate 910 from the first main surface side.

The present invention has been made to overcome the above-mentioned drawbacks, and it is an object of the present invention to provide a method of manufacturing a semiconductor device which can manufacture a semiconductor device where a parasitic built-in diode recovery loss can be made small compared to a case where an electron beam irradiating step is not performed, and the semiconductor device has a threshold voltage $V_{TH}$ characteristic substantially equal to a threshold voltage $V_{TH}$ characteristic in the case where the electron beam irradiating step is not performed.

[1] A method of manufacturing a semiconductor device according to the present invention includes in a following order:

a MOS structure forming step where a gate electrode is formed on a first main surface side of a semiconductor base substrate with a gate insulation film interposed therebetween and, thereafter, an interlayer insulation film is formed so as to cover the gate electrode;

a metal layer forming step where a metal layer in a state of being connected with the gate electrode is formed over the interlayer insulation film;

an electron beam irradiating step where a lattice defect is formed in the inside of the semiconductor base substrate by irradiating an electron beam to the semiconductor base substrate from the first main surface side or a second main surface side in a state where the metal layer is set to a ground potential;

a metal layer dividing step where the metal layer is divided into a plurality of electrodes; and an annealing step where the lattice defect in the semiconductor base substrate is repaired by heating the semiconductor base substrate.

[2] In the method of manufacturing a semiconductor device of the present invention, it is preferable that, in the electron beam irradiating step, the semiconductor base substrate be placed on a tray made of a conductive material in a state where the first main surface of the semiconductor base substrate is directed upward and, thereafter, an electron beam be irradiated to the semiconductor base substrate in a state where the tray is grounded.

[3] It is preferable that the method of manufacturing a semiconductor device of the present invention further include a sintering step where an ohmic junction is formed between the semiconductor base substrate and the metal layer by heating the semiconductor base substrate and the metal layer, the sintering step being performed between the metal layer forming step and the electron beam irradiating step.

[4] In the method of manufacturing a semiconductor device of the present invention, it is preferable that, in the annealing step, a temperature at which the semiconductor base substrate is heated fall within a range of from 300° C. to 410° C.

[5] In the method of manufacturing a semiconductor device of the present invention, it is preferable that the metal layer dividing step and the annealing step be performed in a state where a temperature of the semiconductor base substrate is 410° C. or below.

[6] It is preferable that the method of manufacturing a semiconductor device further include a surface protective film forming step for forming a surface protective film on a surface of the semiconductor base substrate in a latter stage of the electron beam irradiating step.

[7] In the method of manufacturing a semiconductor device of the present invention, it is preferable that the surface protective film forming step be performed in a state where a temperature of the semiconductor base substrate is 410° C. or below.

[8] It is preferable that the method of manufacturing a semiconductor device of the present invention further include a back surface metal layer forming step for forming a back surface metal layer on a second main surface side of the semiconductor base substrate in a latter stage of the surface protective film forming step, wherein the back surface metal layer forming step be performed in a state where a temperature of the semiconductor base substrate is 410° C. or below.

Advantageous Effects of Invention

According to the method of manufacturing a semiconductor device of the present invention, a lattice defect is formed in the inside of the semiconductor base substrate in the electron beam irradiating step. Accordingly, in the same manner as the case of a conventional method of manufacturing a semiconductor device, a lifetime of a carrier at the time of turning off a parasitic built-in diode is properly controlled and hence, it is possible to manufacture a semiconductor device which exhibits a small parasitic built-in diode recovery loss.

According to the method of manufacturing a semiconductor device of the present invention, the electron beam irradiating step can be performed in a state where the metal layer is set to a ground potential, that is, in a state where the gate electrode is set to a ground potential. Accordingly, the gate insulation film is set to a ground potential (a potential equal to potentials of other constitutional elements such as the gate electrode) and hence, even when a charge is generated in the gate insulation film in the course of performing the electron beam irradiating step, the gate insulation film is not charged. Accordingly, a threshold voltage $V_{TH}$ of a manufactured semiconductor device minimally becomes low. As a result, it is possible to manufacture a semiconductor device having a threshold voltage $V_{TH}$ characteristic equal to a threshold voltage $V_{TH}$ characteristic in a case where the electron beam irradiating step is not performed.

As a result, the method of manufacturing a semiconductor device of the present invention is a method of manufacturing a semiconductor device which can manufacture a semiconductor device where a parasitic built-in diode recovery loss can be made small compared to a case where the electron beam irradiating step is not performed and, at the same time, the semiconductor device having a threshold voltage $V_{TH}$ characteristic equal to a threshold voltage $V_{TH}$ characteristic in the case where the electron beam irradiating step is not performed can be manufactured.

According to the method of manufacturing a semiconductor device of the present invention, the electron beam irradiating step is performed in a state where the metal layer is set to a ground potential, that is, in a state where the gate electrode is set to a ground potential and hence, even when a charge is generated in the gate insulation film in the course of performing the electron beam irradiating step, the gate insulation film is set to a ground potential (a potential equal to potentials of other constitutional elements such as the gate electrode) whereby the gate insulation film is not charged. Accordingly, it is possible to prevent lowering of a threshold voltage $V_{TH}$ of a particular portion of a manufactured semiconductor device and hence, it is possible to prevent an electric current from flowing into the particular portion in a concentrated manner. As a result, it is possible to prevent the generation of heat at the particular portion and hence, it is possible to manufacture a semiconductor device having high SOA resistance.

BRIEF DESCRIPTION OF DRAWINGS

FIG. 1A and FIG. 1B are plan views showing a semiconductor device 100 according to an embodiment 1, wherein FIG. 1A is the plan view of the semiconductor device 100, and FIG. 1B is the plan view of the semiconductor device 100 where the illustration of a surface protective film is omitted.

FIG. 2A to FIG. 2C are views showing the semiconductor device 100 according to the embodiment 1, wherein FIG. 2A is a plan view of the semiconductor device 100 where the illustration of the surface protective film, a source electrode and an interlayer insulation film is omitted, FIG. 2B is a cross-sectional view of the semiconductor device 100 taken along a line x-x in FIG. 2A, and FIG. 2C is a cross-sectional view of the semiconductor device 100 taken along a line y-y in FIG. 2A (the same explanation of drawings being adopted by FIG. 11A to FIG. 11C and FIG. 14A to FIG. 14C). In FIG. 2B and FIG. 2C, the illustration of the surface protective film, the source electrode and the interlayer insulation film is not omitted. In FIG. 2B and FIG. 2C, "x" indicates lattice defects (the same explanation of drawings being adopted by FIG. 6B and FIG. 6C, FIG. 7, FIG. 9B and FIG. 9C, FIG. 10B and FIG. 10C, FIG. 11B and FIG. 11C, FIG. 14B and FIG. 14C, FIG. 15A and FIG. 15B, FIG. 16, and FIG. 21A and FIG. 21B).

FIG. 4A to FIG. 4C are views for explaining a MOS structure forming step in the embodiment 1, wherein FIG. 4A is a plan view of a semiconductor base substrate (semiconductor device), FIG. 4B is a cross-sectional view of the semiconductor base substrate taken along a line x-x in FIG. 4A, and FIG. 4C is a cross-sectional view of the semiconductor base substrate taken along a line y-y in FIG. 4A (the same explanation of drawings being adopted by FIG. 5A to FIG. 5C, FIG. 6A to FIG. 6C, FIG. 9A to FIG. 9C, and FIG. 10A to FIG. 10C). In FIG. 4A, the illustration of an interlayer insulation film 126 is omitted.

In FIG. 6B and FIG. 6C, to facilitate the understanding of the electron beam irradiating step, a symbol which indicates that a semiconductor base substrate 110, agate electrode 124, a surface metal layer 128', and a gate lead line 136 are set to a ground potential is described.

FIG. 8A and FIG. 8B are schematic views for explaining the manner of a potential of a source electrode S, a potential of a gate electrode G, and a potential of a drain electrode D in the electron beam irradiating step, wherein FIG. 8A is the schematic view for explaining the manner of the potential of the source electrode S, the potential of the gate electrode G, and the potential of the drain electrode D in the electron beam irradiating step in the embodiment 1, and FIG. 8B is the schematic view for explaining the manner of the potential of the source electrode S, the potential of the gate electrode G, and the potential of the drain electrode D in the conventional electron beam irradiating step.

FIG. 15A and FIG. 15B are views for explaining an electron beam irradiating step in a modification 2, wherein FIG. 15A is a cross-sectional view showing the structure corresponding to the structure shown in FIG. 6B, and FIG. 15B is a cross-sectional view showing the structure corresponding to the structure shown in FIG. 6C.

FIG. 18A and FIG. 18B are views for explaining a conventional MOS structure forming step, wherein FIG. 18A is a cross-sectional view of a cell region, and FIG. 18B is a cross-sectional view of a peripheral region (the same explanation of drawings being adopted by FIG. 19A to FIG. 21B). Symbol 912 indicates a low-resistance semiconductor layer, symbol 914 indicates adrift layer, symbol 916 indicates abase region, symbol 918 indicates a p$^+$-type projecting diffusion region, symbol 920 indicates a source region, symbol 932 indicates a p$^+$-type diffusion region, symbol 934 indicates a field insulation film, symbol 936 indicates a gate lead line, and symbol 938 indicates a contact hole.

DESCRIPTION OF EMBODIMENTS

Hereinafter, a method of manufacturing a semiconductor device according to the present invention is described based on embodiments shown in drawings. The respective drawings are schematic views and do not strictly reflect actual sizes necessarily.

Embodiment 1

1. Configuration of Semiconductor Device 100 According to Embodiment 1

Figure 1A:
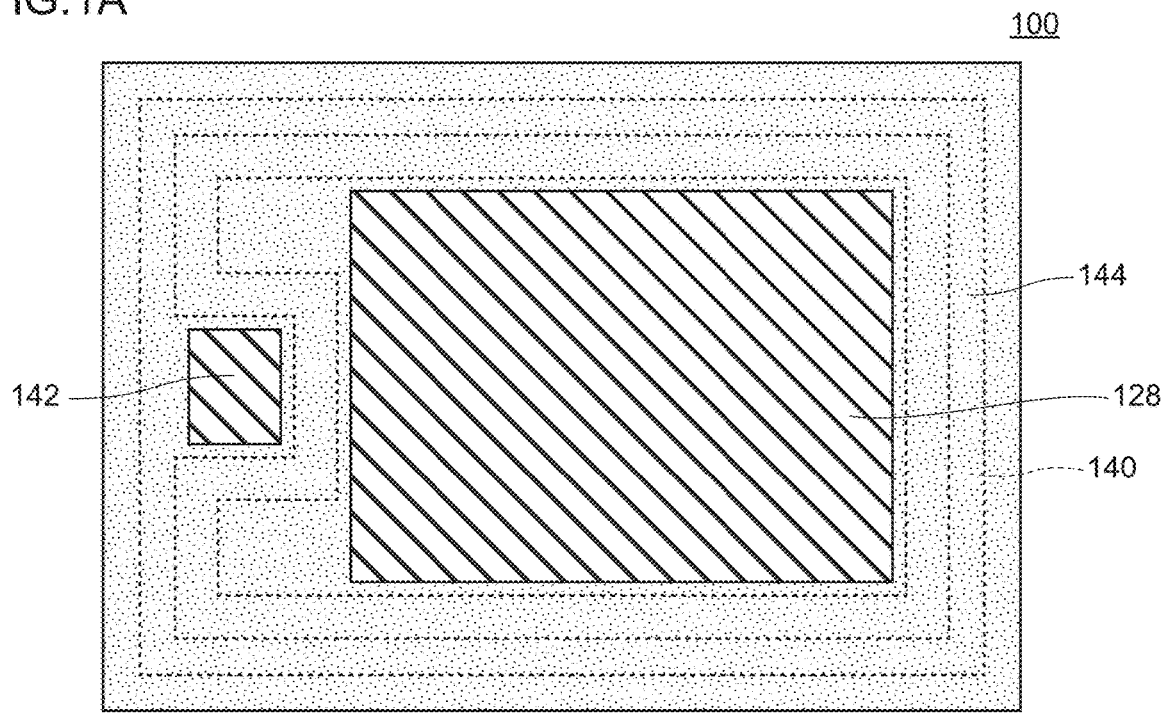
Figure 1B:
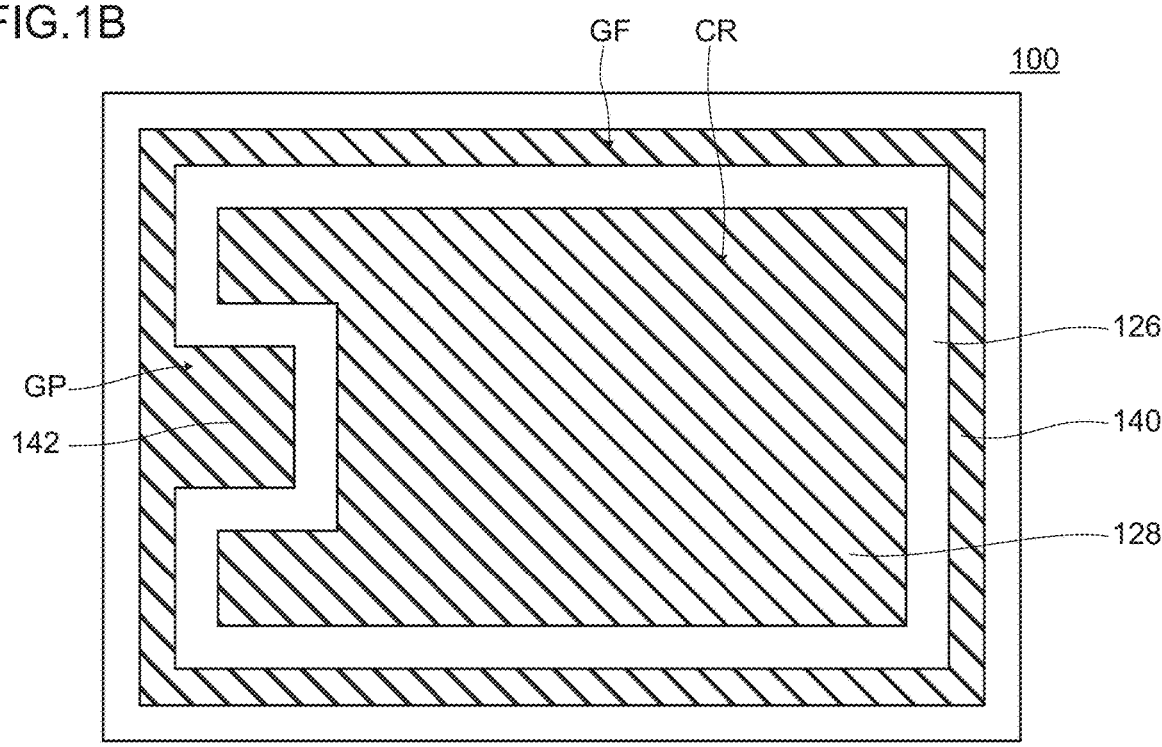
Figure 2A:
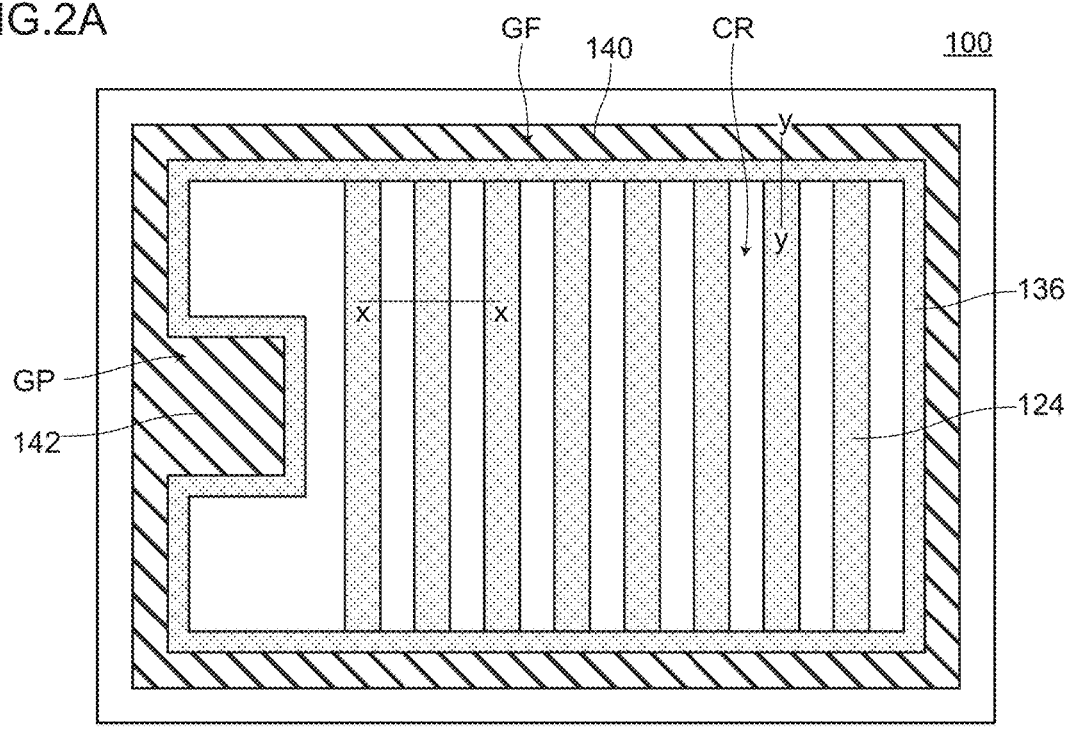

The semiconductor device 100 according to the embodiment is a planar-type semiconductor device (MOSFET) which includes: a cell region CR defined on a semiconductor base substrate 110 where an n$^+$-type low-resistance semiconductor layer 112 and an n$^-$-type drift layer 114 are stacked to each other; and a peripheral region defined around the cell region CR (see FIG. 2A). The peripheral region is formed of: a gate line forming region GF which surrounds the cell region CR; and a gate pad forming region GP projecting toward the cell region CR (toward the inside) (see FIG. 1B and FIG. 2A).

A source electrode 128 is formed on a surface of a first main surface of the semiconductor base substrate 110 in the cell region CR (see FIG. 1B). A gate line 140 (gate finger) is formed on the surface of the first main surface of the semiconductor base substrate 110 in the gate line forming region GF (see FIG. 1B). A gate pad electrode 142 is formed on the surface of the first main surface of the semiconductor base substrate 110 in the gate pad forming region GP (see FIG. 1A). A thickness of the source electrode 128, a thickness of the gate line 140 and a thickness of the gate pad electrode 142 fall within a range of from 3 μm to 6 μm, for example.

On a first main surface side of the semiconductor base substrate 110, the semiconductor base substrate 110 is covered by a surface protective film 144 except for a region of the gate pad electrode 142 which is connected to the outside and a region of the source electrode 128 which is connected to the outside (see FIG. 1A). The surface protective film 144 is formed using polyimide, PSG or BPSG, for example (polyimide in the embodiment 1). A thickness of the surface protective film 144 falls within a range of from 3 μm to 6 μm, for example.

Figure 2B:
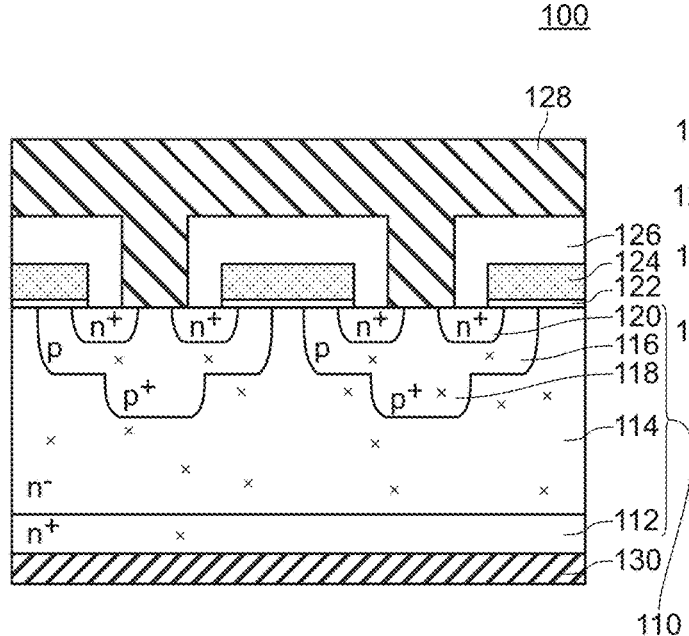

As shown in FIG. 2A and FIG. 2B, the semiconductor device 100 according to the embodiment 1 includes in the cell region CR: the semiconductor base substrate 110; a gate electrode 124 formed on the surface of the first main surface of the semiconductor base substrate 110 by way of a gate insulation film 122; and an interlayer insulation film 126 formed so as to cover the gate electrode 124. That is, a MOS structure is formed on a first main surface side in the cell region CR of the semiconductor base substrate 110.

The semiconductor device 100 according to the embodiment 1 further includes in the cell region CR: a source electrode 128 formed on the semiconductor base substrate 110 on a first main surface side such that the source electrode 128 covers the interlayer insulation film 126, a part of a base region 116 of the semiconductor base substrate 110 and a part of the source region 120; and a drain electrode 130 formed of a multi-layered metal film such as a Ti—Ni—Au film on a surface of the semiconductor base substrate 110 on a second main surface side.

In the cell region CR, the semiconductor base substrate 110 includes: an n$^+$-type low-resistance semiconductor layer 112; an n$^-$-type drift layer 114 formed on the low-resistance semiconductor layer 112; the p-type base region 116 formed on a surface of the drift layer 114; a p$^+$-type projecting diffusion region 118 formed so as to project downward (in a depth direction) from the base region 116; and an n+-type source region 120 formed on a surface of the base region 116.

Lattice defects generated by irradiating an electron beam exist in the inside of the semiconductor base substrate 110.

The gate electrode 124 is made of polysilicon, and is formed on a surface of the base region 116 sandwiched between the drift layer 114 and the source region 120 by way of the gate insulation film 122.

Figure 2C:
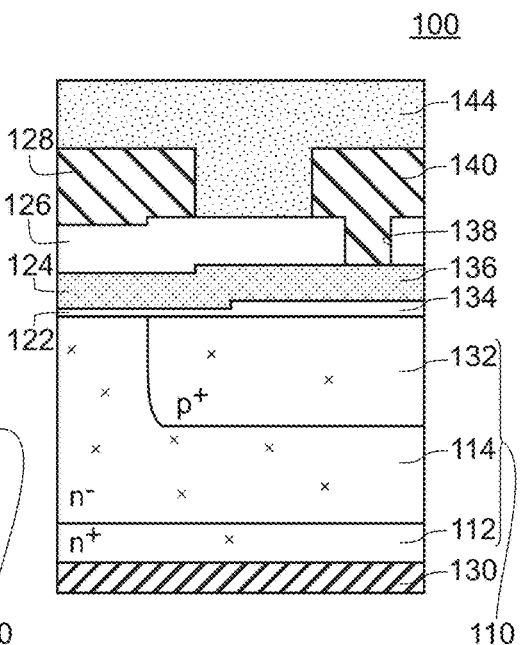

As shown in FIG. 2A and FIG. 2C, the semiconductor device 100 according to the embodiment 1 includes, in the gate line forming region GF, the semiconductor base substrate 110, a field oxide film 134, a gate lead line 136, the interlayer insulation film 126, the gate line 140, the drain electrode 130, and the surface protective film 144.

In the gate line forming region GF, the semiconductor base substrate 110 includes the n+-type low-resistance semiconductor layer 112, the n−-type drift layer 114 formed on the low-resistance semiconductor layer 112, and a p+-type diffusion region 132 formed on the surface of the drift layer 114.

The gate lead line 136 is made of polysilicon, and is formed over the drift layer 114 by way of the field oxide film 134. The gate lead line 136 is connected to the gate electrode 124.

The gate line 140 is formed on the gate lead line 136 by way of the interlayer insulation film 126, and is electrically connected to the gate lead line 136 via a contact hole 138 formed in the interlayer insulation film 126.

In the gate pad forming region GP, the semiconductor device 100 according to the embodiment 1 has substantially the same configuration as the gate line forming region basically except for a point that the gate pad electrode 142 is formed in place of the gate line 140. That is, in the gate pad forming region GP, the semiconductor device 100 according to the embodiment 1 includes the semiconductor base substrate 110, the field oxide film 134, the gate lead line 136, the interlayer insulation film 126, the gate pad electrode 142, and the drain electrode 130.

The gate pad electrode 142 is formed on the gate lead line 136 by way of the interlayer insulation film 126. The gate pad electrode 142 is connected to the gate line 140.

All of the base regions 116, the source regions 120, the p+-type projecting diffusion regions 118, the gate insulation films 122, and the gate electrodes 124 are formed in a stripe pattern as viewed in a plan view. Forming pitches are 15 μm respectively, for example.

A thickness of the low-resistance semiconductor layer 112 is set to a value which falls within a range of from 100 μm to 400 μm, and dopant concentration of the low-resistance semiconductor layer 112 is set to a value which falls within a range of from $1 \times 10^{19}$ cm$^{-3}$ to $1 \times 10^{20}$ cm$^{-3}$. A thickness of the drift layer 114 is set to a value which falls within a range of from 5 μm to 100 μm, and dopant concentration of the drift layer 114 is set to a value which falls within a range of from $1 \times 10^{14}$ cm$^{-3}$ to $1 \times 10^{16}$ cm$^{-3}$. A depth of the base region 116 is set to a value which falls within a range of from 2 μm to 2.5 μm, and dopant concentration of the base region 116 is set to a value which falls within a range of from $5 \times 10^{16}$ cm$^{-3}$ to $1 \times 10^{18}$ cm$^{-3}$. A depth of the source region 120 is set to a value which falls within a range of from 0.2 μm to 0.4 μm, and dopant concentration of the source region 120 is set to a value which falls within a range of from $5 \times 10^{19}$ cm$^{-3}$ to $2 \times 10^{20}$ cm$^{-3}$. A depths of the p+-type projecting diffusion region 118 and the p+-type diffusion region 132 are set to values which fall within a range of from 2.4 μm to 8.0 μm, and dopant concentrations of the p+-type projecting diffusion region 118 and the p+-type diffusion region 132 are set to values which fall within a range of from $1 \times 10^{17}$ cm$^{-3}$ to $3 \times 10^{18}$ cm$^{-3}$.

The gate electrode 124 and the gate lead line 136 are made of polysilicon which contains a dopant at a predetermined concentration. The gate electrode 124 and the gate lead line 136 are formed in the same step. A thickness of the gate electrode 124 is set to 500 nm, for example.

The gate insulation film 122 is formed of a silicon dioxide film which is formed by a thermal oxidation method and has a thickness of 100 nm, for example. The field oxide film 134 is formed of a silicon dioxide film which is formed by a thermal oxidation method and has a thickness of 450 nm, for example. The interlayer insulation film 126 is formed of a PSG film which is formed by a CVD method and has a thickness of 1000 nm.

2. Method of Manufacturing a Semiconductor Device According to Embodiment 1

Figure 3:
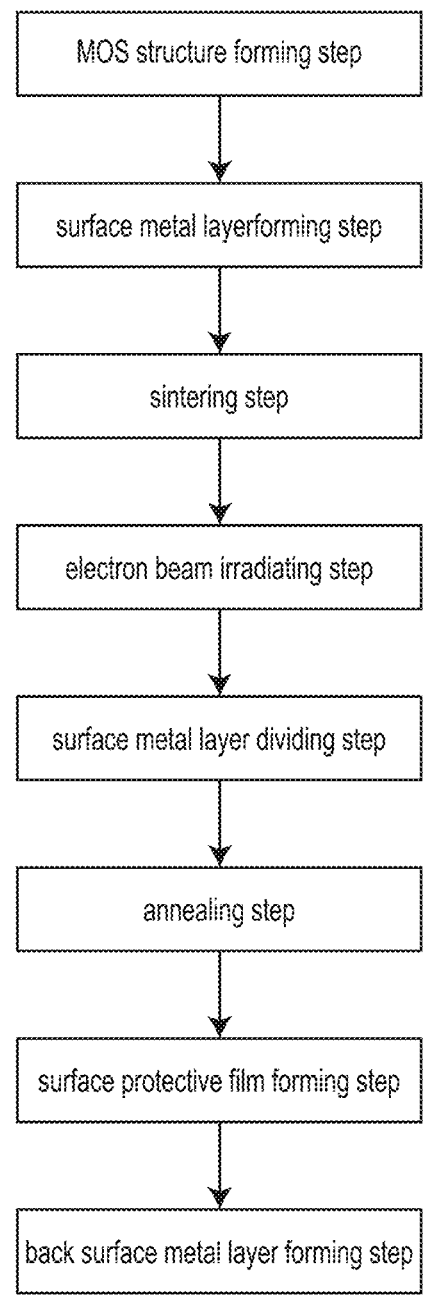
FIG. 3 is a flowchart showing the semiconductor device 100 according to the embodiment 1.

The semiconductor device 100 according to the embodiment can be manufactured by a method of manufacturing a semiconductor device described hereinafter (method of manufacturing a semiconductor device according to the embodiment 1). The method of manufacturing a semiconductor device according to the embodiment 1 includes, as shown in FIG. 3, a MOS structure forming step, a surface metal layer forming step (metal layer forming step), a sintering step, an electron beam irradiating step, a surface metal layer dividing step (metal layer dividing step), an annealing step, a surface protective film forming step, and a back surface metal layer forming step in this order.

(1) MOS Structure Forming Step

Figure 4A:
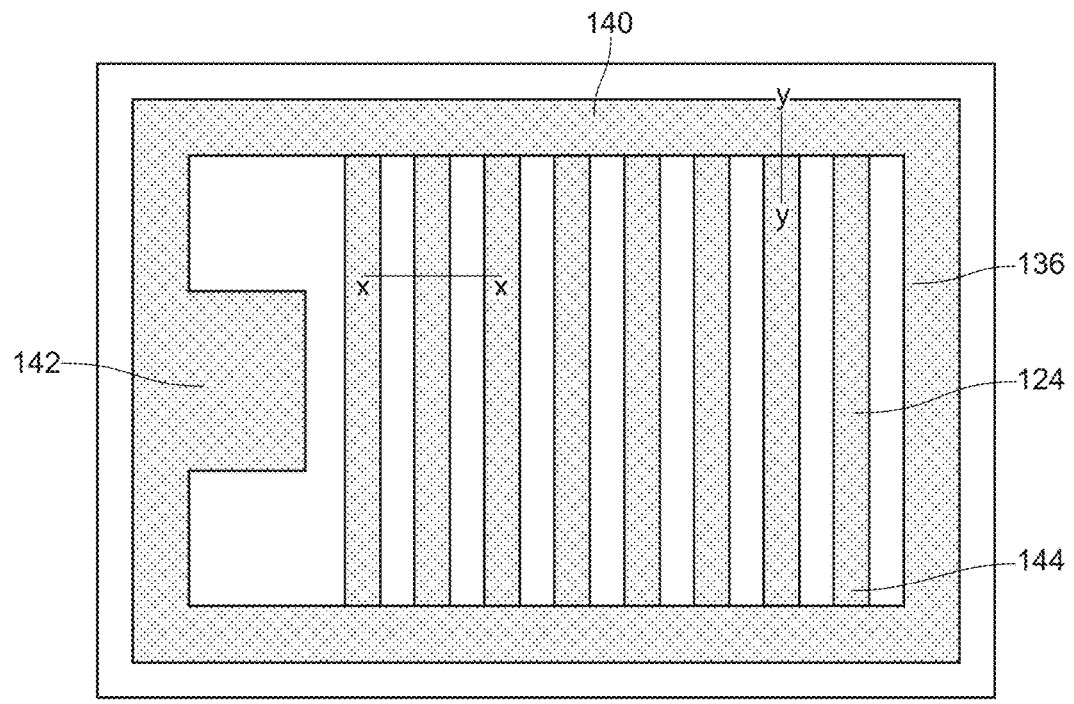
Figures 4B, 4C:
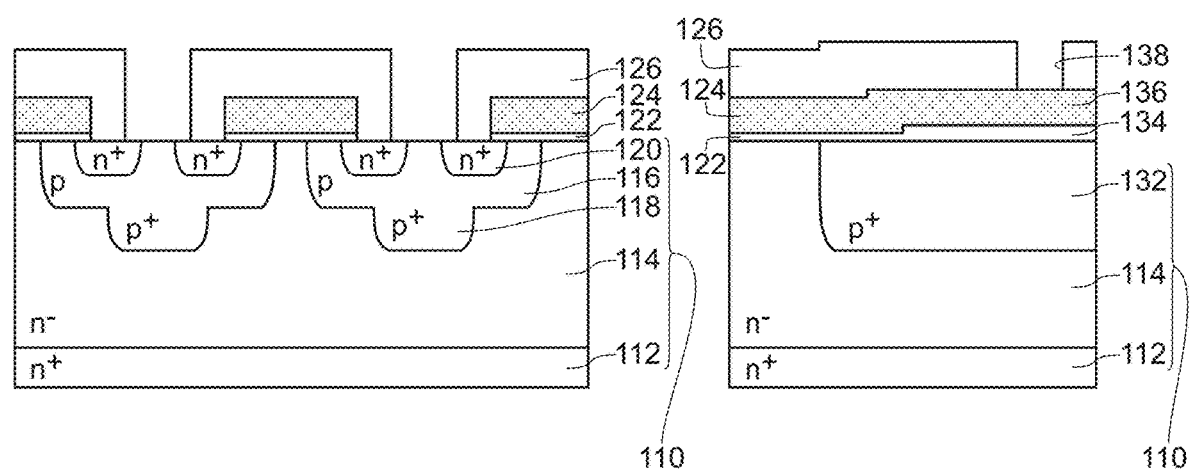

Firstly, a gate electrode 124 is formed on a first main surface side of a semiconductor base substrate 110 (semiconductor wafer) by way of a gate insulation film 122. Thereafter, an interlayer insulation film 126 is formed so as to cover the gate electrode 124 (see FIG. 4A to FIG. 4C).

Specifically, firstly, a semiconductor base substrate 110 having a surface on which a field oxide film 134 is formed is prepared. A portion of a drift layer 114, a portion of a base region 116 and a portion of a source region 120 are exposed by etching the field oxide film 134 in a cell region CR on a first main surface side. Then, the gate insulation film 122 is formed by a thermal oxidation method.

The semiconductor base substrate 110 includes, in the cell region CR, an n+-type low-resistance semiconductor layer 112, an n−-type drift layer 114 formed on the low-resistance semiconductor layer 112, a p-type base region 116 formed on a surface of the drift layer 114, an n+-type source region 120 formed on a surface of the base region 116, and a p+-type projecting diffusion region 118 formed downwardly (in a depth direction) in a projecting manner from the base region 116. The semiconductor base substrate 110 includes, in a peripheral region, the n+-type low-resistance semiconductor layer 112, the n−-type drift layer 114 formed on the low-resistance semiconductor layer 112, and the p+-type diffusion region 132 formed on a surface of the drift layer 114. The field oxide film 134 is formed by heat treatment (active annealing treatment performed after introduction of a p-type dopant and/or an n-type dopant) performed at the time of forming the constitutional elements such as the source region 120, the base region 116 and the p+-type projecting diffusion region 118. A thickness of the gate insulation film 122 is set to 100 nm, for example.

Next, the gate electrode 124 made of polysilicon is formed on the first main surface side of the semiconductor base substrate 110 by way of a gate insulation film 122 and, at the same time, a gate lead line 136 made of polysilicon is formed on the first main surface side of the semiconductor base substrate 110 by way of the field oxide film 134 by a CVD method.

Next, the interlayer insulation film 126 made of PSG is formed by a CVD method so as to cover the gate electrode 124.

Next, in the cell region CR, for connecting a surface metal layer 128' described later to the source region 120 of the semiconductor base substrate 110, openings through which portions of the base region 116 and portions of the source region 120 are exposed are formed in the cell region CR. Also in the gate line forming region GF, a contact hole 138 is formed in a predetermined region of the interlayer insulation film 126 for connecting the surface metal layer 128' described later to the gate lead lines 136 (see FIG. 4A to FIG. 4C).

(2) Surface Metal Layer Forming Step

Figure 5A:
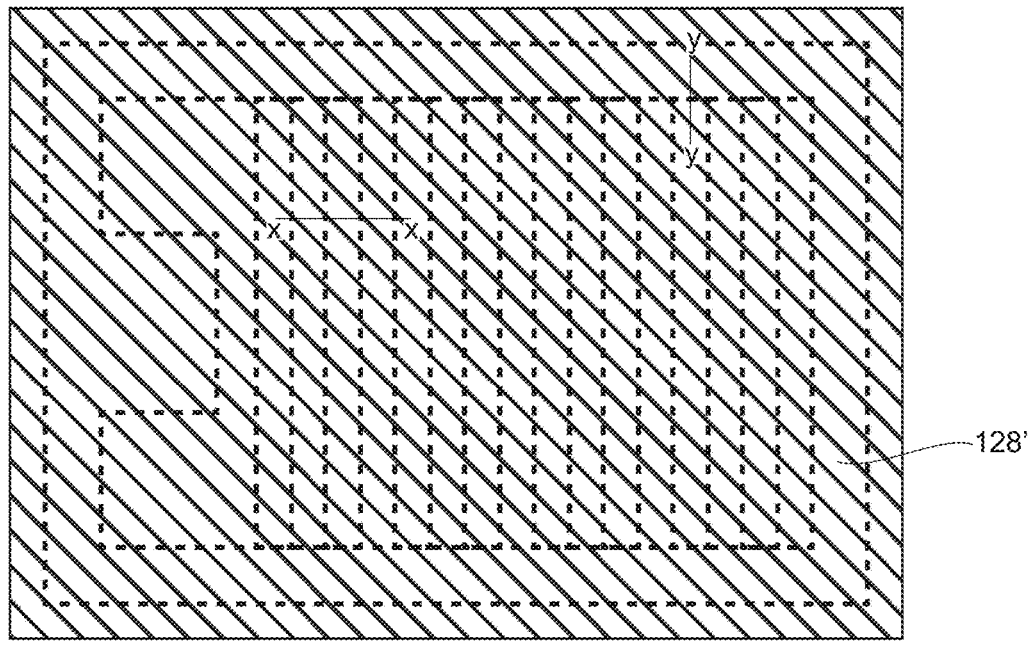
FIG. 5A to FIG. 5C are views for explaining a surface metal layer forming step in the embodiment 1.
Figure 5B:
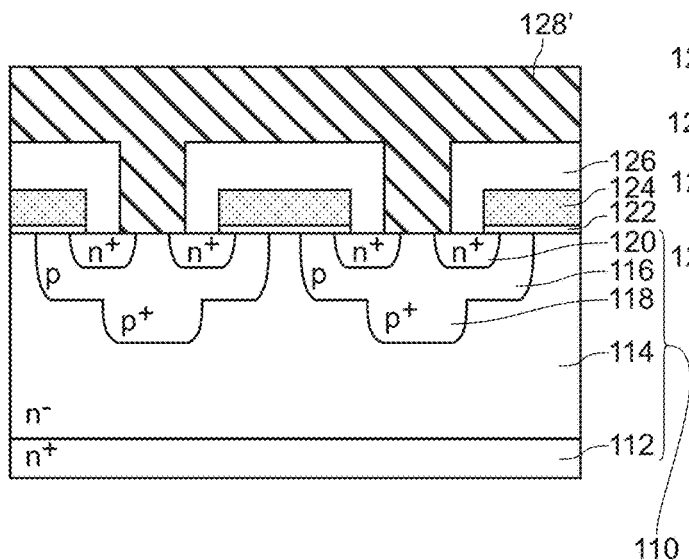
Figure 5C:
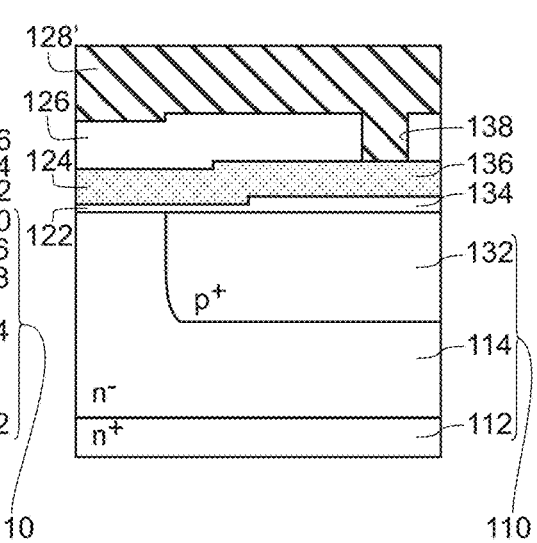

Next, the surface metal layer 128' is formed on the whole first main surface side of the semiconductor base substrate 110 (over the interlayer insulation film 126) by a sputtering method (see FIG. 5A to FIG. 5C). In the cell region CR, the surface metal layer 128' is connected to the source region 120 and the base region 116 formed in the semiconductor base substrate 110 through the openings formed in the interlayer insulation film 126. Further, in the gate line forming region GF, the surface metal layer 128' is connected to the gate lead line 136 through the contact hole 138. A thickness of the surface metal layer 128' is set to a value which falls within a range of from 3 µm to 6 µm, for example. By setting the thickness of the surface metal layer 128' to such a value, in the electron beam irradiating step performed later, an electron beam passes through the surface metal layer 128' (without being interrupted by the surface metal layer 128') and is irradiated to the semiconductor base substrate.

(3) Sintering Step

Next, an ohmic junction is formed between the semiconductor base substrate 110 and the surface metal layer 128' by heating the semiconductor base substrate 110 and the surface metal layer 128' (not shown in the drawing). In the sintering step, a temperature at which the semiconductor base substrate 110 and the surface metal layer 128' are heated falls within a range of from 400° C. to 500° C. The sintering step may be performed in a hydrogen atmosphere.

(4) Electron Beam Irradiating Step

Figure 6A:
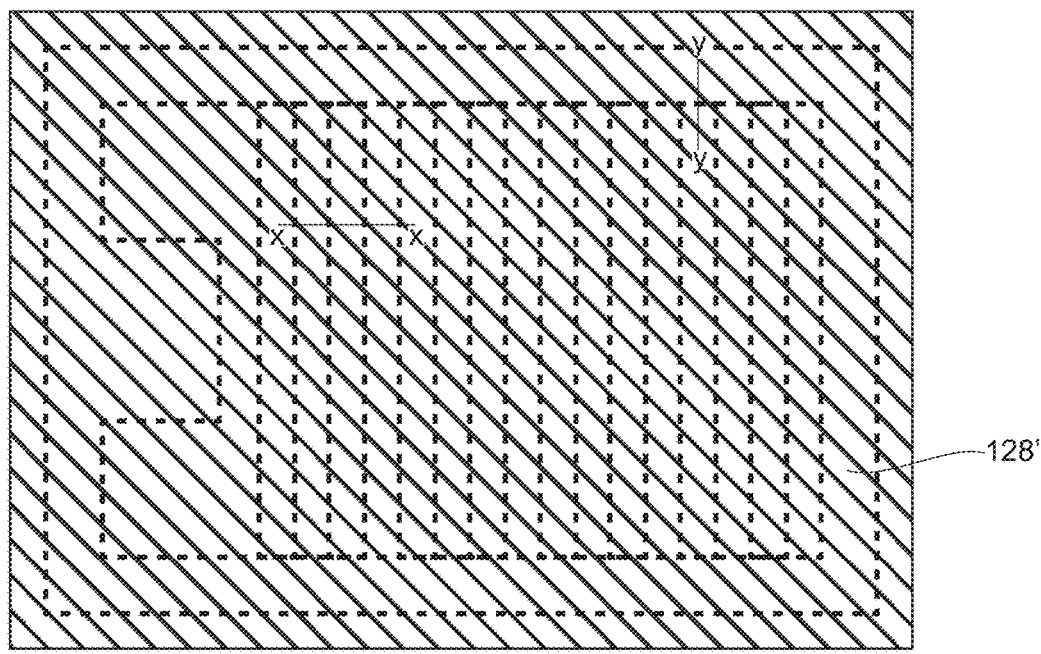
FIG. 6A to FIG. 6C are views for explaining an electron beam irradiating step in the embodiment 1.
Figure 6B:
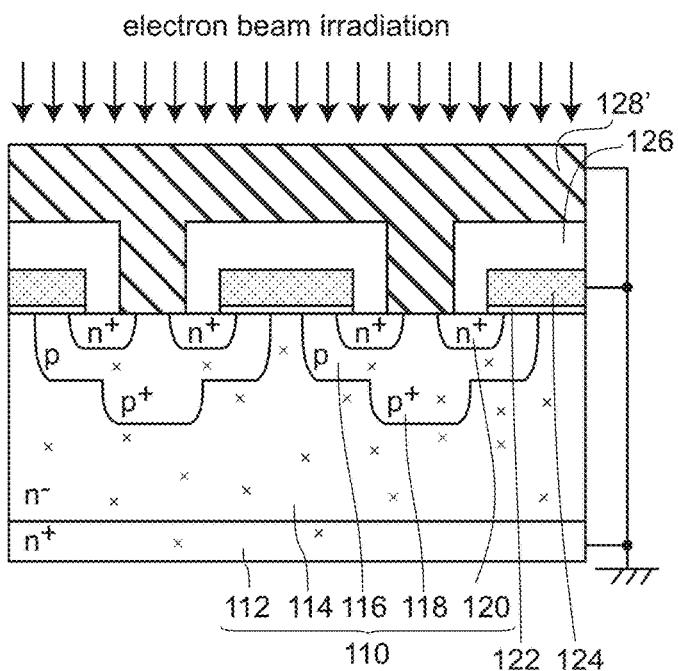
Figure 6C:
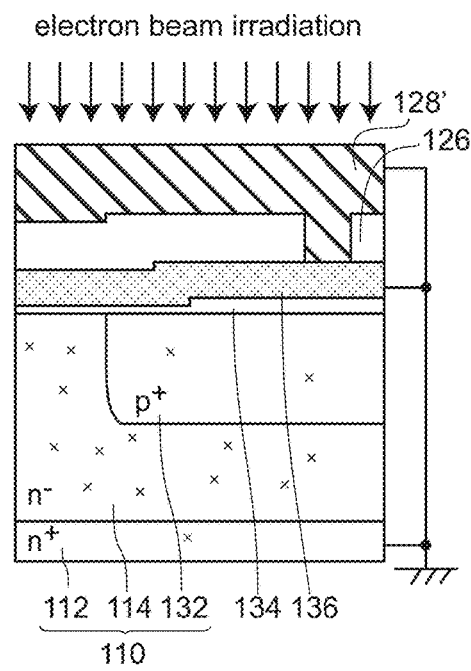
Figure 7:
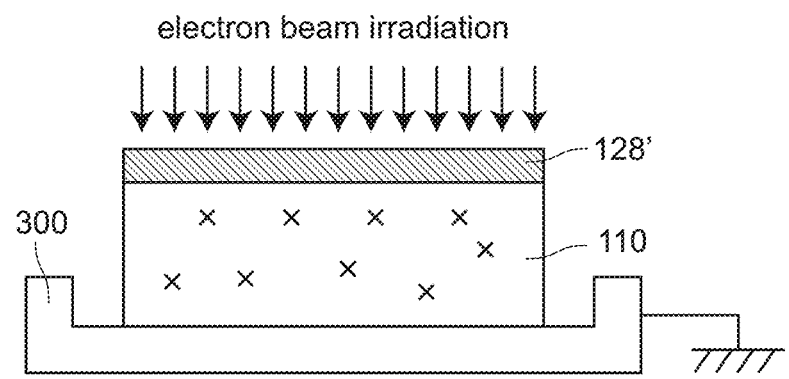
FIG. 7 is a view for explaining the manner of irradiating an electron beam to the semiconductor base substrate 110.
Figure 8A:
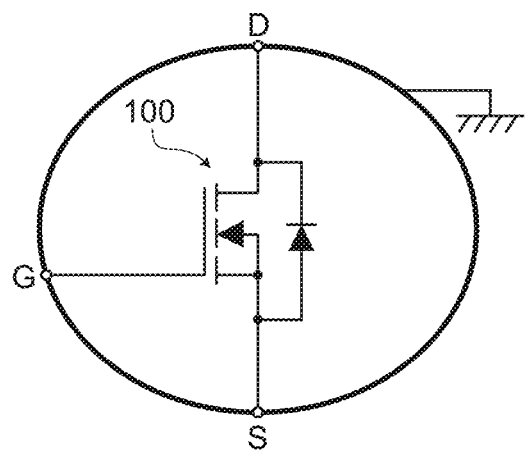
Figure 8B:
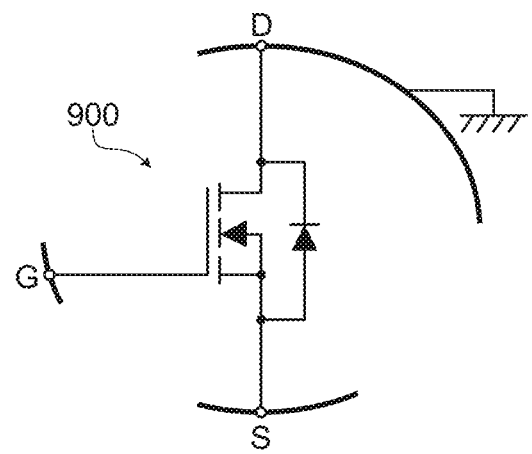

Next, an electron beam is irradiated to the semiconductor base substrate 110 from a first main surface side in a state where the surface metal layer 128' is set to a ground potential thus forming lattice defects in the inside of the semiconductor base substrate 110 (see FIG. 6A to FIG. 6C). To be more specific, as shown in FIG. 7, the semiconductor base substrate 110 having the first main surface side on which the surface metal layer 128' is formed is placed on a tray 300 made of aluminum with the first main surface side directed upward, and an electron beam is irradiated to the semiconductor base substrate 110 from the first main surface side. With such an operation, in the electron beam irradiating step of this embodiment 1, unlike a conventional electron beam irradiating step where a potential of a gate electrode is brought into a floating state (see FIG. 8B), an electron beam can be irradiated to the semiconductor base substrate 110 in a state where all of a potential of the source electrode, a potential of the drain electrode, and a potential of the gate electrode are set to a ground potential (a state in a potential equal to the ground potential) (see FIG. 8A).

The reason the tray 300 is made of aluminum is that aluminum has high conductivity so that the electron beam irradiating step can be performed in a state where the surface metal layer 128' is set to a ground potential, that is, in a state where the gate electrode is set to a ground potential. An irradiation amount of an electron beam can be set to a suitable irradiation amount necessary for property controlling a lifetime of a carrier at the time of turning off a parasitic built-in diode. For example, an irradiation amount of an electron beam falls within a range of from 100 kGy to 3000 kGy.

(5) Surface Metal Layer Dividing Step

Figure 9A:
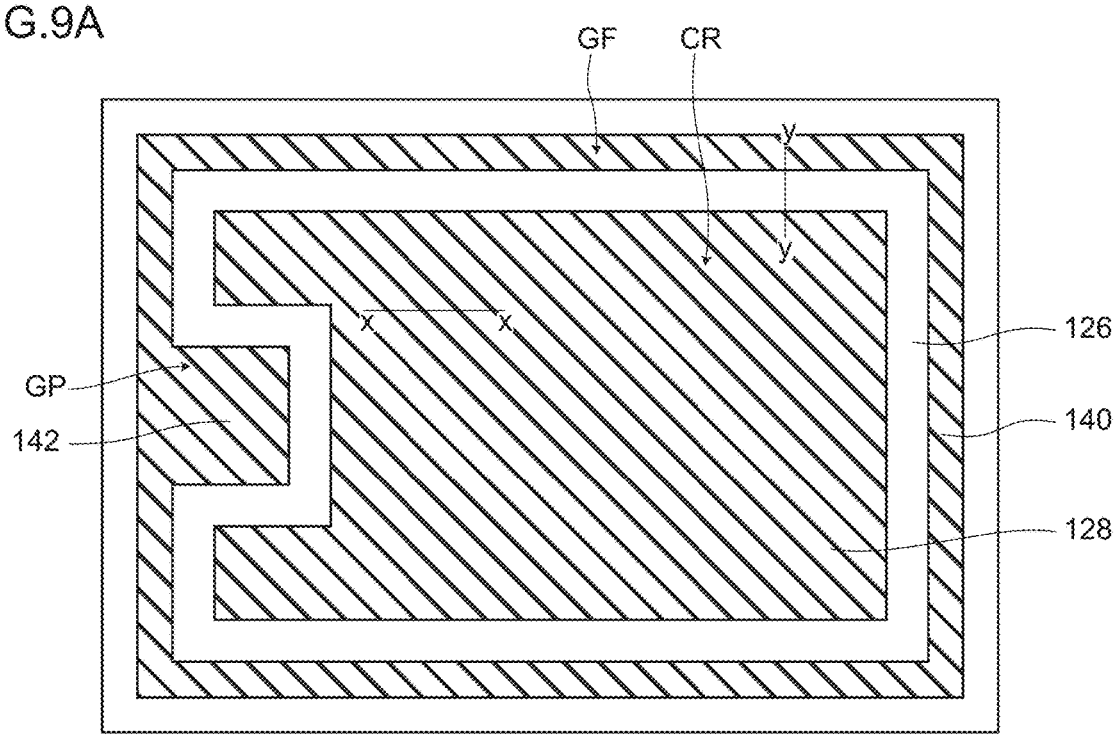
FIG. 9A to FIG. 9C are views for explaining a surface metal layer dividing step in the embodiment 1.
Figure 9B:
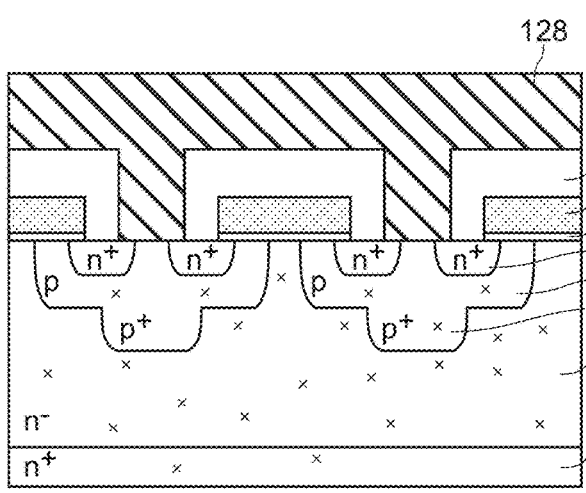
Figure 9C:
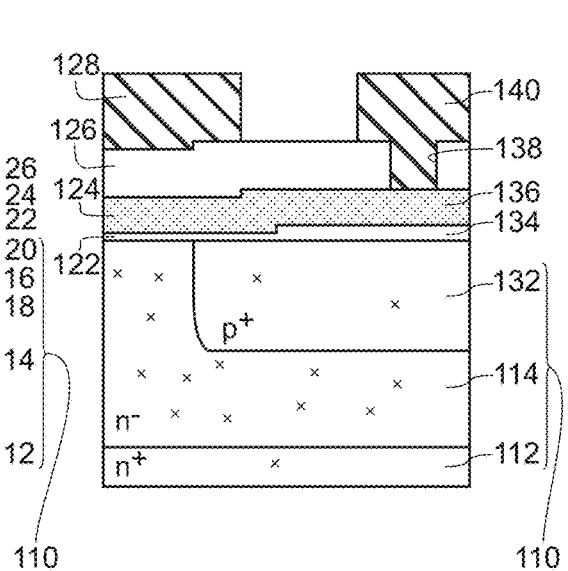

Next, the semiconductor base substrate 110 is taken out from the tray 300, and the surface metal layer 128' is divided into a plurality of electrodes by etching in a state where a temperature of the semiconductor base substrate is 410° C. or below (see FIG. 9A to FIG. 9C). That is, the surface metal layer 128' is separated into electrodes (a gate pad electrode 142 and a gate line 140) which are connected to the gate electrode 124, and an electrode (source electrode 128) which is not connected to the gate electrode 124. The surface metal layer dividing step is a step corresponding to a patterning step of a conventional method of manufacturing a semiconductor device. There may be a case where a shield metal (edge termination electrode) is formed at a position corresponding to an outer peripheral edge of the semiconductor device. In this case, in the surface metal layer dividing step, the surface metal layer 128' is divided into the gate pad electrode 142, the gate line 140, the source electrode 128 and the shield metal (not shown in the drawing).

(6) Annealing Step

Next, the lattice defects in the semiconductor base substrate 110 are repaired by heating the semiconductor base substrate 110 (not shown in the drawing). At this stage of operation, a temperature at which the semiconductor base substrate 110 is heated is 410° or below, and preferably falls within a range of from 300° C. to 410° C. For example, such a temperature is 350° C. A heating time can be set to a suitable time. For example, the heating time is 90 minutes.

In the annealing step, hydrogen annealing treatment (annealing treatment under a hydrogen atmosphere) is not performed. This is because even when hydrogen annealing treatment is not performed, as described later, a threshold voltage $V_{TH}$ of a manufactured semiconductor device minimally becomes low and hence, it is possible to manufacture a semiconductor device having a threshold voltage $V_{TH}$ characteristic substantially equal to a threshold voltage $V_{TH}$ characteristic in the case where an electron beam irradiating step is not performed. Another reason is that the semiconductor device can be manufactured safely.

(7) Surface Protective Film Forming Step

Figure 10A:
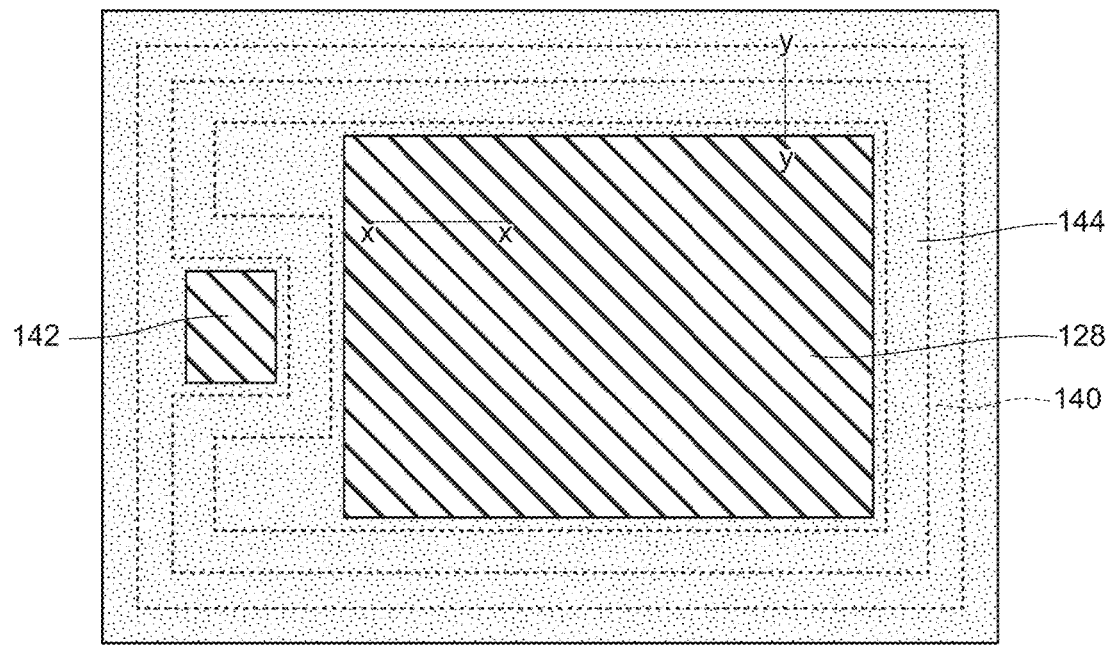
FIG. 10A to FIG. 10C are views for explaining a surface protective film forming step in the embodiment 1.
Figure 10B:
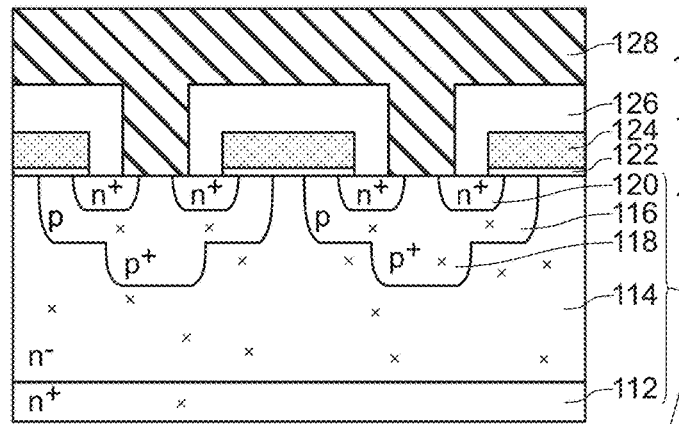
Figure 10C:
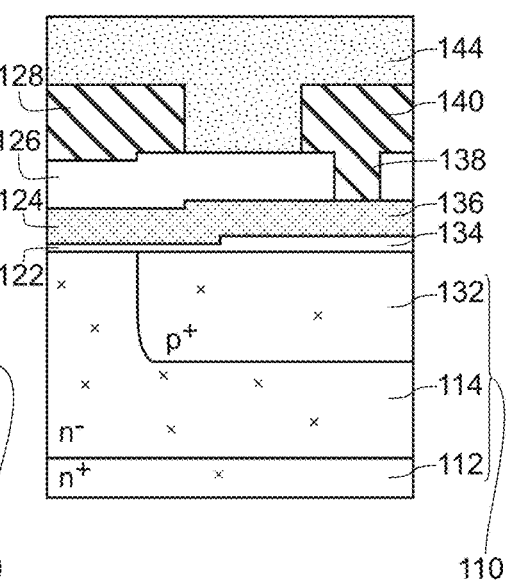

Next, a surface protective film 144 is formed on the first main surface of the semiconductor base substrate 110 except for a part of the source electrode 128 and a part of the gate pad electrode 142 in a state where a temperature of the semiconductor base substrate 110 is 410° C. or below (see FIG. 10A to FIG. 10C). The surface protective film 144 is made of polyimide, PSG or BPSG, for example (polyimide in the embodiment 1). A thickness of the surface protective film 144 falls within a range of from 3 µm to 6 µm, for example.

(8) Back Surface Metal Layer Forming Step

Next, in a state where a temperature of the semiconductor base substrate 110 is 410° C. or below, a back surface metal film (back surface metal layer) formed of a multi-layered metal film such as a Ti—Ni—Au film is formed on a second main surface of the semiconductor substrate 110 (film forming), and such aback surface metal film forms a drain electrode 130.

Next, the semiconductor base substrate 110 is cut by dicing or the like thus forming the semiconductor base substrate 110 into chips so that semiconductor devices 100 are manufactured.

The semiconductor device (semiconductor device according to the embodiment 1) 100 can be manufactured in accordance with the above-mentioned steps.

3. Advantageous Effects of Method of Manufacturing Semiconductor Device According to Embodiment 1

According to the method of manufacturing a semiconductor device of the embodiment 1, in the electron beam irradiating step, the lattice defects are formed in the inside of the semiconductor base substrate 110. Accordingly, in the same manner as the conventional method of manufacturing a semiconductor device, a lifetime of a carrier at the time of turning off the parasitic built-in diode is properly controlled and hence, it is possible to manufacture a semiconductor device where a parasitic built-in diode recovery loss is small.

Further, according to the method of manufacturing a semiconductor device of the embodiment 1, the electron beam irradiating step can be performed in a state where the surface metal layer 128' is set to a ground potential, that is, in a state where the gate electrode 124 is set to a ground potential and hence, the gate insulation film 122 is set to a ground potential (a potential equal to potentials of other constitutional elements such as the gate electrode) whereby even when a charge is generated in the gate insulation film 122 in the course of performing the electron beam irradiating step, the gate insulation film 122 is not charged. Accordingly, a threshold voltage $V_{TH}$ of a manufactured semiconductor device is minimally lowered. As a result, it is possible to manufacture a semiconductor device having a threshold voltage $V_{TH}$ characteristic substantially equal to a threshold voltage $V_{TH}$ characteristic in a case where an electron beam irradiating step is not performed.

As a result, the method of manufacturing a semiconductor device according to the embodiment 1 is a method of manufacturing a semiconductor device which can manufacture a semiconductor device which can reduce a parasitic built-in diode recovery loss compared to a case where an electron beam irradiating step is not performed, and has a threshold voltage $V_{TH}$ characteristic substantially equal to a threshold voltage $V_{TH}$ characteristic in a case where an electron beam irradiating step is not performed.

According to the method of manufacturing a semiconductor device of the embodiment 1, the electron beam irradiating step is performed in a state where the surface metal layer 128' is set to a ground potential, that is, in a state where the gate electrode 124 is set to a ground potential and hence, even when a charge is generated in the gate insulation film 122 in the course of performing the electron beam irradiating step, the gate insulation film 122 is set to a ground potential (a potential equal to potentials of other constitutional elements such as the gate electrode) whereby the gate insulation film 122 is not charged. Accordingly, it is possible to prevent lowering of a threshold voltage $V_{TH}$ of a particular portion of the manufactured semiconductor device and hence, it is possible to prevent an electric current from flowing into the particular portion in a concentrated manner. As a result, it is possible to prevent the generation of heat at the particular portion and hence, it is possible to manufacture a semiconductor device having high SOA resistance.

According to the method of manufacturing a semiconductor device of the embodiment 1, in the electron beam irradiating step, the semiconductor base substrate 110 is placed on the tray 300 made of a conductive material in a state where the first main surface side of the semiconductor base substrate 110 is directed upward and, thereafter, an electron beam is irradiated to the semiconductor base substrate 110 in a state where the tray 300 is grounded. Accordingly, an electron beam irradiation can be performed in a state where the surface metal layer 128' is surely set to a ground potential. As a result, a phenomenon that the gate insulation film 122 is charged in the course of performing the electron beam irradiating step is eliminated. Accordingly, it is possible to overcome a drawback that a threshold voltage $V_{TH}$ of a semiconductor device is lowered due to charging of the gate insulation film 122.

The method of manufacturing a semiconductor device according to the embodiment 1 includes the sintering step where an ohmic junction is formed between the semiconductor base substrate 110 and the surface metal layer 128' by heating the semiconductor base substrate 110 and the surface metal layer 128'. Accordingly, a resistance between the semiconductor base substrate 110 and the surface metal layer 128' (source electrode 128) is reduced. As a result, it is possible to manufacture a semiconductor device having a small ON resistance.

The method of manufacturing a semiconductor device according to the embodiment 1 includes the sintering step for forming an ohmic junction between the semiconductor base substrate 110 and the surface metal layer 128' by heating the semiconductor base substrate 110 and the surface metal layer 128' between the surface metal layer forming step and the electron beam irradiating step. By performing the sintering step after the irradiation of an electron beam, there is no possibility that lattice defects in the semiconductor base substrate 110 are repaired more than necessary (the lattice defects being excessively repaired). Accordingly, it is possible to manufacture a semiconductor device where a lifetime of a carrier at the time of turning off a parasitic built-in diode is properly controlled.

According to the method of manufacturing a semiconductor device of the embodiment 1, in the annealing step, a temperature at which the semiconductor base substrate 110 is heated falls within a range of from 300° C. to 410° C. and hence, there is no possibility that lattice defects in the semiconductor base substrate 110 are repaired more than necessary (the lattice defects being excessively repaired). Accordingly, it is possible to manufacture a semiconductor device where a lifetime of a carrier at the time of turning off a parasitic built-in diode is properly controlled.

In the method of manufacturing a semiconductor device according to the embodiment 1, the metal layer dividing step and the annealing step are performed in a state where a temperature of the semiconductor base substrate 110 is 410° C. or below and hence, there is no possibility that lattice defects in the semiconductor base substrate 110 are completely repaired. Accordingly, the lattice defects can be repaired while leaving the lattice defects to an extent that a lifetime control can be performed.

The method of manufacturing a semiconductor device according to the embodiment 1 includes the surface protective film forming step for forming the surface protective film 144 on the surface of the semiconductor base substrate 110 and hence, the surface of the semiconductor device can be properly protected.

In a case where an electron beam is irradiated in a state where a surface protective film (polyimide) is formed on the surface of the semiconductor base substrate 110, there is a possibility that a threshold voltage $V_{TH}$ of the gate insulation film 122 is decreased due to charging of the surface protective film 144. On the other hand, the method of manufacturing a semiconductor device according to the embodiment 1 includes the surface protective film forming step for forming the surface protective film 144 on the surface of the semiconductor base substrate 110 in the latter stage of the electron beam irradiating step and hence, it is possible to prevent a phenomenon that the surface protective film 144 (polyimide) is charged due to the irradiation of an electron beam to the surface protective film 144. Accordingly, it is possible to prevent lowering of a threshold voltage $V_{TH}$ of the gate insulation film 122 which may be caused by charging of the surface protective film 144.

In the method of manufacturing a semiconductor device according to the embodiment 1, the surface protective film forming step is performed in a state where a temperature of the semiconductor base substrate 110 is 410° C. or below and hence, there is no possibility that lattice defects in the semiconductor base substrate 110 are completely repaired. Accordingly, the lattice defects can be repaired while leaving the lattice defects to an extent that a lifetime control can be performed.

The method of manufacturing a semiconductor device according to the embodiment 1 further includes the back surface metal layer forming step for forming the back surface metal layer on the second main surface side of the semiconductor base substrate in the latter stage of the surface protective film forming step, and the back surface metal layer forming step is performed in a state where a temperature of the semiconductor base substrate is 410° C. or below whereby also in this step, there is no possibility that lattice defects in the semiconductor base substrate 110 are completely repaired. Accordingly, the lattice defects can be repaired while leaving the lattice defects to an extent that a lifetime control can be performed.

Embodiment 2

Figure 11A:
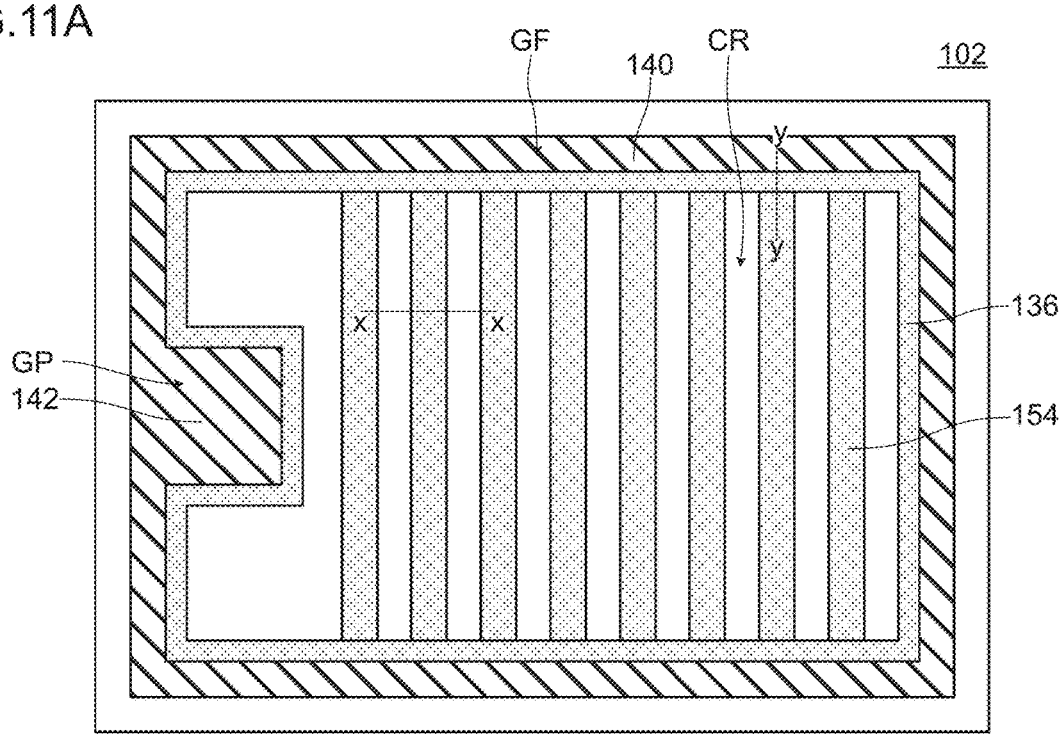
FIG. 11A to FIG. 11C are views showing a semiconductor device 102 according to an embodiment 2.
Figure 11B:
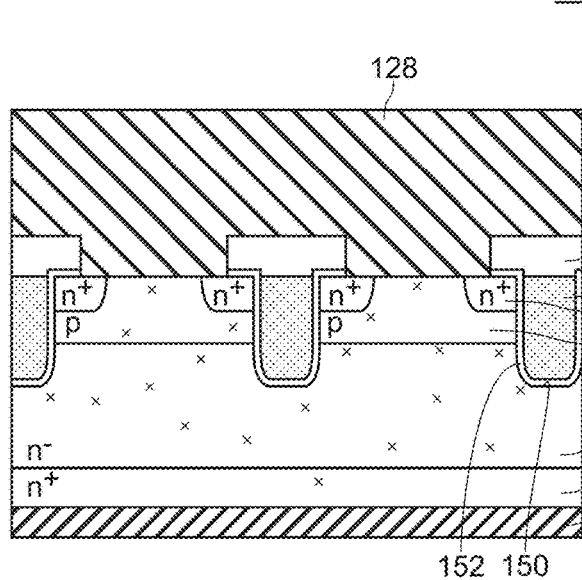
Figure 11C:
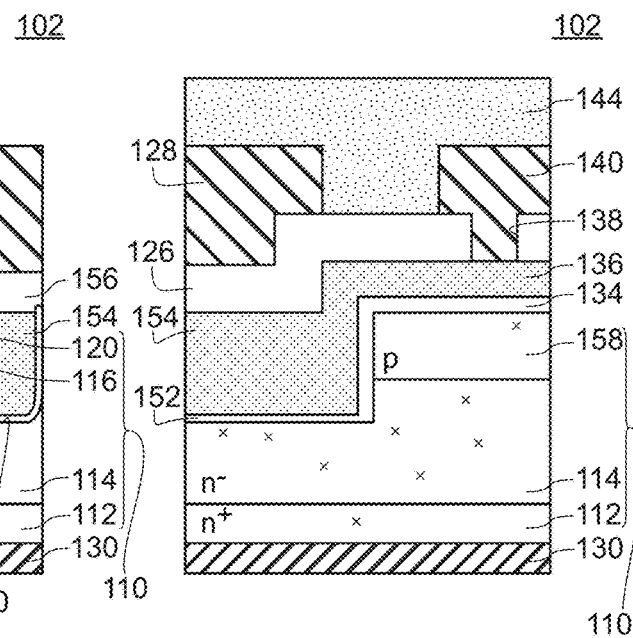

In the method of manufacturing a semiconductor device according to the embodiment 2 basically includes substantially the same steps as the method of manufacturing a semiconductor device according to the embodiment 1. However, the method of manufacturing a semiconductor device according to the embodiment 2 differs from the method of manufacturing a semiconductor device according to the embodiment 1 with respect to a point that a trench-gate-type MOSFET is manufactured in place of the planar-gate-type MOSFET. As shown in FIG. 11A to FIG. 11C, in the method of manufacturing a semiconductor device according to the embodiment 2, the semiconductor base substrate 110 includes, in a cell region CR, a low-resistance semiconductor layer 112, a drift layer 114, a p-type base region 116 formed on a surface of the drift layer 114, and a source region 120 disposed within the base region 116 and formed such that at least a portion of the source region 120 is exposed to an inner peripheral surface of a trench 150 described later. The semiconductor device 102 has a plurality of trenches 150 formed in a base region 116 on a first main surface side of the semiconductor base substrate 110 such that the trenches 150 reach the drift layer 114. In the semiconductor device 102, a gate insulation film 152 is formed on an inner peripheral surface of each trench 150, and a gate electrode 154 is embedded in the inside of the trench 150 by way of the gate insulation film 152.

The semiconductor base substrate 110 includes, in a gate line forming region GF, an $n^+$-type low-resistance semiconductor layer 112, an $n^-$-type drift layer 114 formed on the low-resistance semiconductor layer 112, and a p-type diffusion region 158 formed on a surface of the drift layer 114.

In this manner, the method of manufacturing a semiconductor device according to the embodiment 2 differs from the method of manufacturing a semiconductor device according to the embodiment 1 with respect to a point that the trench-gate-type MOSFET is manufactured in place of the planar-gate-type MOSFET. However, in the same manner as the method of manufacturing a semiconductor device according to the embodiment 1, an electron beam irradiating step can be performed in a state where a surface metal layer is set to a ground potential, that is, in a state where the gate electrode 154 is set to a ground potential. Accordingly, a parasitic built-in diode recovery loss can be reduced compared to a case where an electron beam irradiating step is not performed and, at the same time, it is possible to manufacture a semiconductor device having a $V_{TH}$ characteristic substantially equal to a threshold voltage $V_{TH}$ characteristic in a case where an electron beam irradiating step is not performed.

The method of manufacturing a semiconductor device of the embodiment 2 has substantially the same steps as the method of manufacturing a semiconductor device of the embodiment 1 with respect to points except for that a trench-gate-type MOSFET is manufactured in place of a planar-gate-type MOSFET. Accordingly, out of the advantageous effects which the method of manufacturing a semiconductor device of the embodiment 1 acquires, the method of manufacturing a semiconductor device of the embodiment 2 can acquire advantageous effects brought about by the configuration substantially equal to the configuration in the method of manufacturing a semiconductor device of the embodiment 1.

[Test]
<Test 1>

The test 1 is a test carried out to confirm that a semiconductor device manufactured by a method of manufacturing a semiconductor device according to the present invention is a semiconductor device having a threshold voltage $V_{TH}$ characteristic substantially equal to a threshold voltage $V_{TH}$ characteristic in a case where an electron beam irradiating step is not performed.

1. Description of Specimens
(1) Specimens 1 (Present Invention Examples)

Basically, approximately 140 pieces of semiconductor devices (semiconductor devices 100 according to the embodiment 1) were prepared by a method substantially equal to the method of manufacturing a semiconductor device according to the embodiment 1, and these semiconductor devices were used as the specimens 1.

(2) Specimens 2 (Comparison Examples 1)

140 pieces of semiconductor devices were prepared by a method substantially equal to the method of manufacturing a semiconductor device according to the embodiment 1 except for a point that a surface metal layer dividing step, a sintering step, a surface protective film forming step, and an annealing step were performed in this order after performing a surface metal layer forming step in the same manner as a conventional method of manufacturing a semiconductor device. These semiconductor devices were used as the specimens 2.

(3) Specimens 3 (Comparison Examples 2)

140 pieces of semiconductor devices were prepared by a method substantially equal to the method of manufacturing a semiconductor device according to the embodiment 1 except for a point that an electron beam irradiating step was not performed. These semiconductor devices were used as the specimens 3.

2. Testing Method

A threshold voltage $V_{TH}$ when a drain current Id was 3 mA and a threshold voltage $V_{TH}2$ when the drain current Id was 10 μA were measured. Then, $V_{TH}$ and $\Delta V_{TH}$ were plotted in a graph where the threshold voltage $V_{TH}$ is taken on an axis of abscissas and $\Delta V_{TH}$ which is calculated by subtracting the threshold voltage $V_{TH}2$ from the threshold voltage $V_{TH}$ is taken on an axis of ordinates, and the evaluation was made on respective specimens.

3. Test Result

Figure 12:
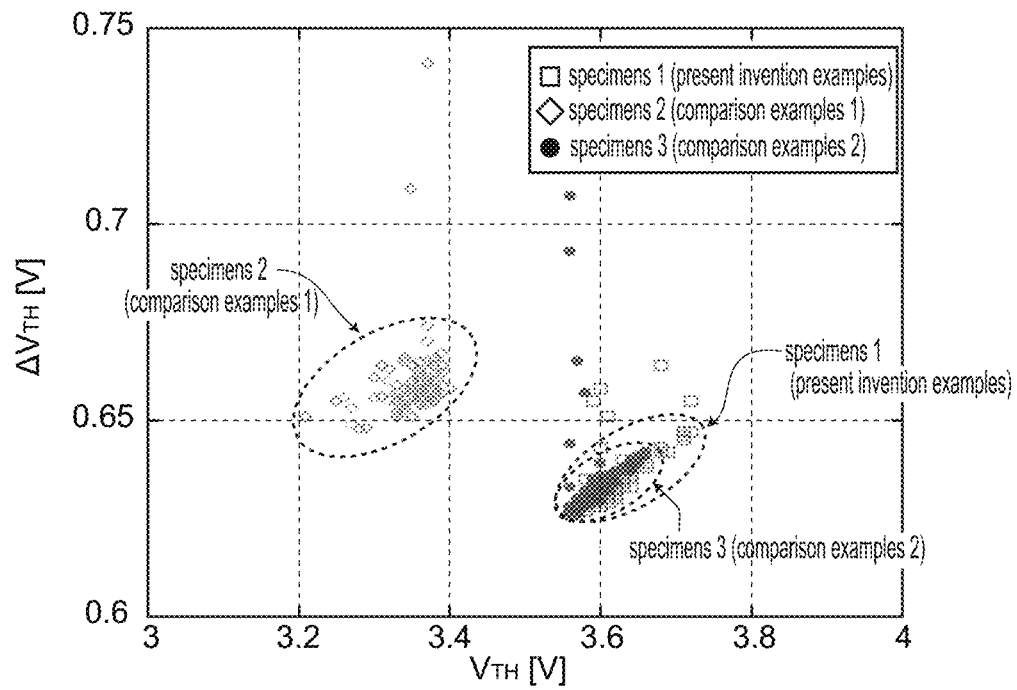
FIG. 12 is a graph showing a result of a test 1.

As can be also understood from FIG. 12, most of specimens 3 (comparison examples 2) are distributed in an area where $V_{TH}$ falls within a range of from approximately 3.5V to 3.7V and $\Delta V_{TH}$ falls within a range of from approximately 0.63V to 0.65V. Most of specimens 2 (comparison examples 1) are distributed in an area where $V_{TH}$ falls within a range of from approximately 3.2V to 3.4V and $\Delta V_{TH}$ falls within a range of from approximately 0.64V to 0.68V. On the other hand, most of specimens 1 (present invention examples) are distributed in an area where $V_{TH}$ falls within a range of from approximately 3.5V to 3.7V and $\Delta V_{TH}$ falls within a range of from approximately 0.63V to 0.65V.

Accordingly, it is found that $V_{TH}$ in the comparison examples 1 is smaller than $V_{TH}$ in the comparison example 2 by approximately 0.3V and $\Delta V_{TH}$ in the comparison examples 1 is larger than $\Delta V_{TH}$ in the comparison examples 2 by approximately 0.02V to 0.03V. Accordingly, it is found that the comparison examples 1 exhibits an inferior threshold voltage $V_{TH}$ compared to a case where an electron beam irradiating step is not performed. On the other hand, it is found that the present invention examples exhibits a threshold voltage substantially equal to a threshold voltage in the comparison examples 2. Accordingly, it is confirmed that the method of manufacturing a semiconductor device according to the present invention can manufacture a semiconductor device having a threshold voltage $V_{TH}$ characteristic substantially equal to a threshold voltage $V_{TH}$ characteristic in a case where an electron beam irradiating step is not performed.

<Test 2>

The test 2 is a test carried out to confirm that, in a semiconductor device manufactured by a method of manufacturing a semiconductor device according to the present invention, irregularities in a $\Delta V_{GS}$ characteristic can be improved and hence, generation of heat in a particular portion in the inside of the manufactured semiconductor device can be prevented whereby it is possible to manufacture a semiconductor device having a high SOA resistance.

1. Description of Specimens

The specimens 1 to the specimens 3 used in the test 1 were also used in the test 2 as it is.

2. Testing Method

Firstly, $V_{GS}(V_{GS}1)$ of the respective manufactured specimens were measured. Next, the respective specimens were heated by applying a predetermined electric power (electric power of 100V·3 A between a gate and a source) and, thereafter, $V_{GS}(V_{GS}2)$ and $V_{TH}$ of the respective specimens were measured again. Then, $V_{TH}$ and $\Delta V_{GS}$ were plotted in a graph where the threshold voltage $V_{TH}$ is taken on an axis of abscissas and $\Delta V_{GS}$ which is calculated by subtracting the threshold voltage $V_{GS}2$ from the threshold voltage $V_{GS}1$ is taken on an axis of ordinates, and the evaluation was made on respective specimens.

3. Test Result

Figure 13:
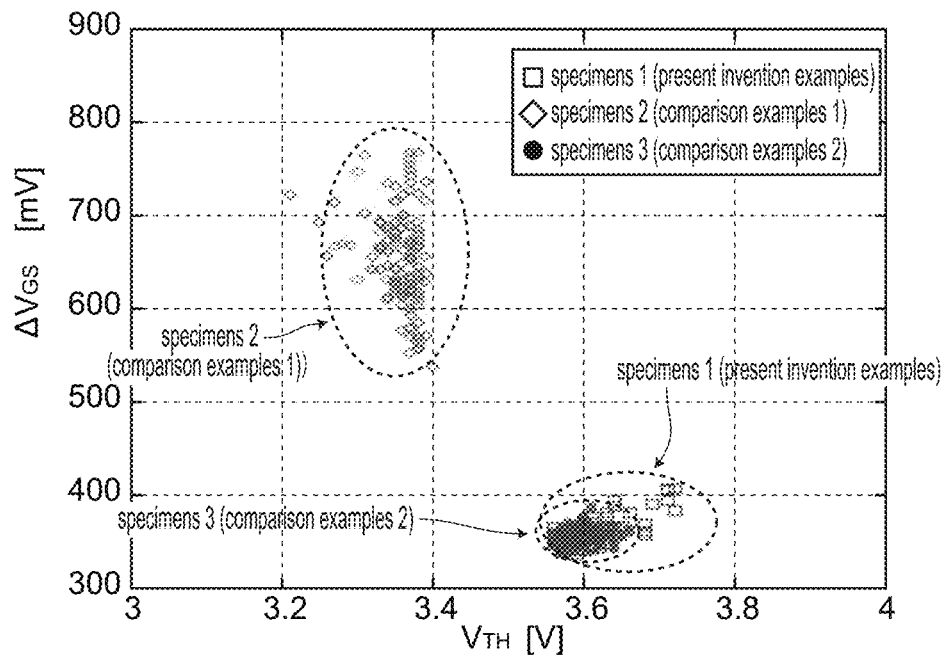
FIG. 13 is a graph showing a result of a test 2.

As can be also understood from FIG. 13, most of specimens 3 (comparison examples 2) are distributed in an area where $V_{TH}$ falls within a range of from 3.5V to 3.7V and $\Delta V_{GS}$ falls within a range of from approximately 340 mV to 400 mV. Most of specimens 2 (comparison examples 1) are distributed in an area where $V_{TH}$ falls within a range of from 3.2V to 3.4V and $\Delta V_{GS}$ falls within a range of from 550 mV to 780 mV. On the other hand, most of specimens 1 (present invention examples) are distributed in an area where $V_{TH}$ falls within a range of from 3.5V to 3.7V and $\Delta V_{GS}$ falls within a range of from 340 mV to 410 mV.

Accordingly, it is found that in the comparison examples 1, $\Delta V_{GS}$ in the comparison examples 1 is larger than $\Delta V_{GS}$ in the comparison examples 2 by 100 mV or more, while $\Delta V_{GS}$ in the present invention examples is substantially equal to $\Delta V_{GS}$ in the comparison examples 2.

The following is confirmed from the above-mentioned test result. That is, in the comparison examples 1, irregularities are generated in a $\Delta V_{GS}$ characteristic and hence, heat is generated in a particular portion in the inside of a semiconductor base substrate whereby a semiconductor device having a high SOA resistance cannot be manufactured. This is because that, in the course of performing an electron beam irradiating step, a charge is generated in a gate insulation film so that the gate insulation film is charged whereby a threshold voltage $V_{TH}$ of a particular portion of a manufactured semiconductor device is lowered. Accordingly, an electric current flows into the particular portion in a concentrated manner thus generating heat in the particular portion.

On the other hand, it is confirmed that, in the present invention examples, irregularities in $\Delta V_{GS}$ characteristic are not generated and hence, generation of heat at a particular portion in the inside of a semiconductor base substrate can be prevented whereby a semiconductor device having a high SOA resistance can be manufactured. This is because that, in the course of performing an electron beam irradiating step, even when a charge is generated in a gate insulation film so that the gate insulation film is charged, the gate insulation film is set to a ground potential (set to a potential equal to potentials of other constitutional elements such as a gate electrode) and hence, the gate insulation film is not charged. Accordingly, it is possible to prevent an electric current from flowing into the particular portion in a concentrated manner and hence, the generation of heat at the particular portion can be prevented.

Although the present invention has been described based on the above-mentioned embodiments heretofore, the present invention is not limited to the above-mentioned embodiments. The present invention can be carried out in various modes without departing from the gist of the present invention, and the following modifications also are conceivable, for example.

(1) The numbers, materials, shapes, positions, sizes and the like of the constitutional elements described in the above-mentioned embodiments are provided only for exemplifying the semiconductor device according to the present invention, and can be changed within a range that advantageous effects of the present invention are not impaired.

Figure 14A:
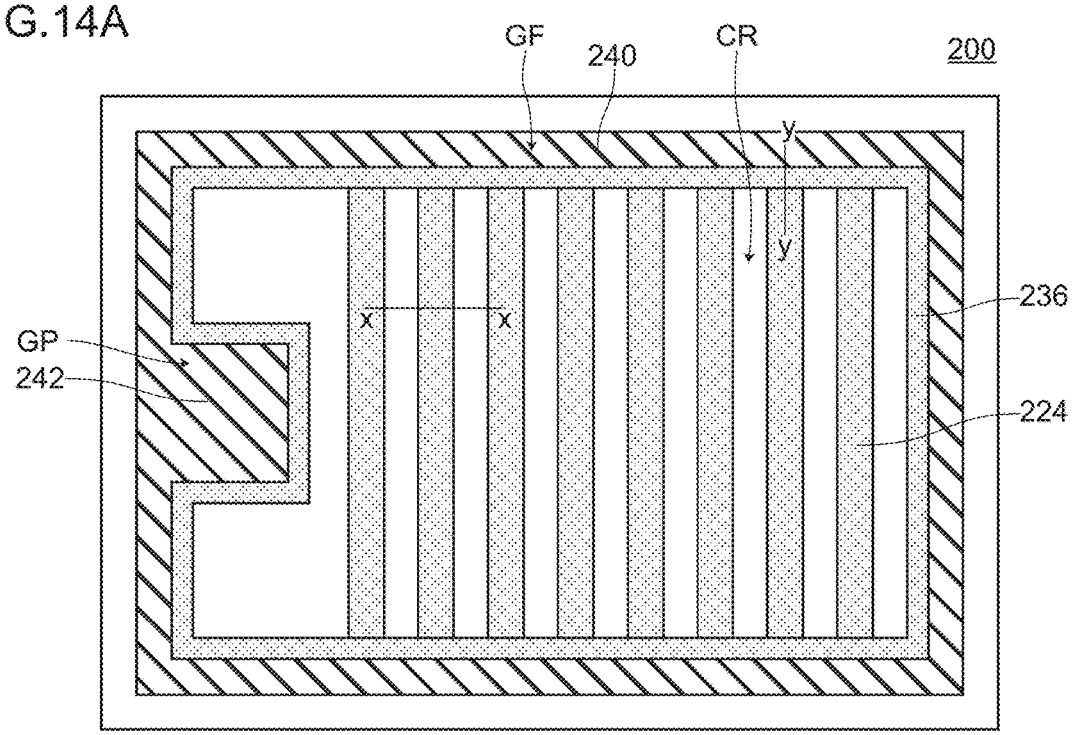
FIG. 14A to FIG. 14C are views showing a semiconductor device 200 according to a modification 1.
Figure 14B:
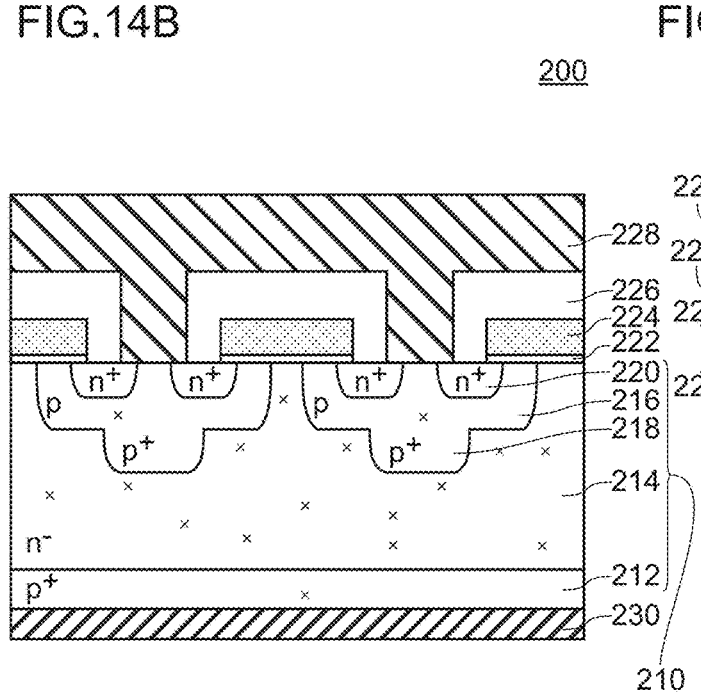
Figure 14C:
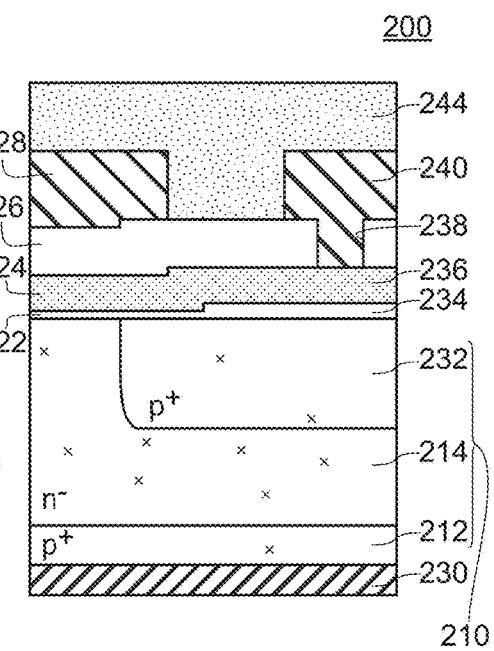

(2) In the above-mentioned respective embodiments, the MOSFET is manufactured as the semiconductor device. However, the present invention is not limited to the MOSFET. As the semiconductor device, an IGBT (for example, a semiconductor device 200 according to a modification 1, see FIG. 14A to FIG. 14C), a junction FET or other suitable transistors may be manufactured.

Figure 15A:
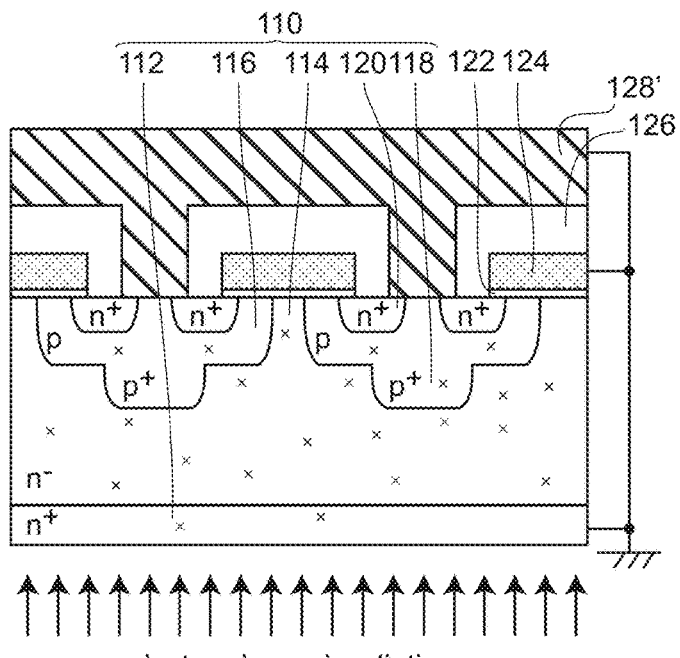
Figure 15B:
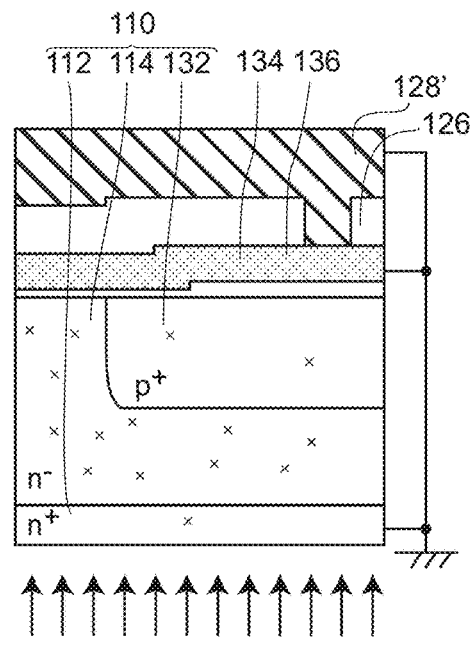

(3) In the above-mentioned respective embodiments, in the electron beam irradiating step, an electron beam is irradiated from the first main surface side. However, the present invention is not limited to such a configuration. In the electron beam irradiating step, an electron beam may be irradiated from a second main surface side (modification 2, see FIG. 15A and FIG. 15B).

(4) In the above-mentioned respective embodiments, the surface metal layer dividing step where the surface metal layer is divided into the plurality of electrode is performed after performing the electron beam irradiating step where an electron beam is irradiated to the semiconductor base substrate in a state where the surface metal layer is set to a ground potential. However, the present invention is not limited to such a configuration. For example, in a case where the electron beam irradiating step is performed in a state where the gate electrode, the source electrode, and the drain electrode are set to the same potential (a state where all of the gate electrode, the source electrode, and the drain electrode are set to a ground potential), the electron beam irradiating step may be performed after the surface metal layer dividing step is performed. As such a case, considered is a case where an electron beam irradiating step is performed in a state where the gate electrode, the source electrode, and the drain electrode are connected to a ground potential outside the semiconductor device after performing the surface metal layer dividing step, for example.

(5) In the above-mentioned respective embodiments, the surface protective film forming step is performed after the annealing step is performed. However, the present invention is not limited to such a configuration. The annealing step may be performed after the surface protective film forming step is performed, or the surface protective film forming step and the annealing step may be performed collectively. In the surface protective film forming step, the semiconductor base substrate is heated to a predetermined temperature of 410° C. or below for forming the surface protective film. By performing the surface protective film forming step and the annealing step in this manner, it is possible to acquire an advantageous effect that annealing treatment can be performed in a state where a temperature of the semiconductor base substrate is relatively high (or the annealing step can be performed collectively with the surface protective film forming step) and hence, an operation time can be shortened.

Figure 16:
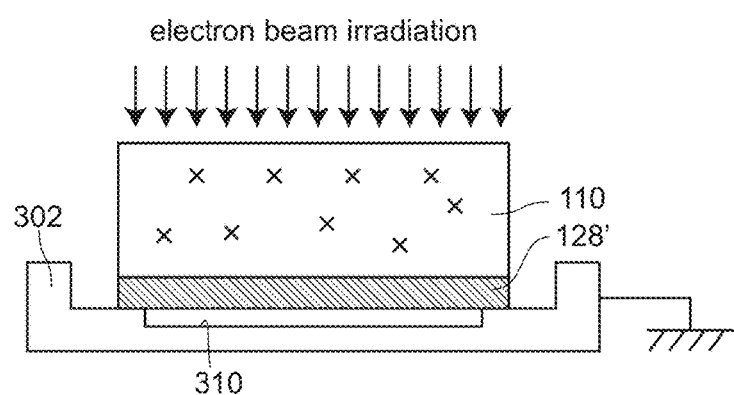
FIG. 16 is a view for explaining the manner where a semiconductor base substrate 110 is placed on a tray in a state where a second main surface of the semiconductor base substrate 110 is directed upward and, thereafter, an electron beam is irradiated to the semiconductor base substrate 110 in a state where the tray is grounded.
Figure 17:
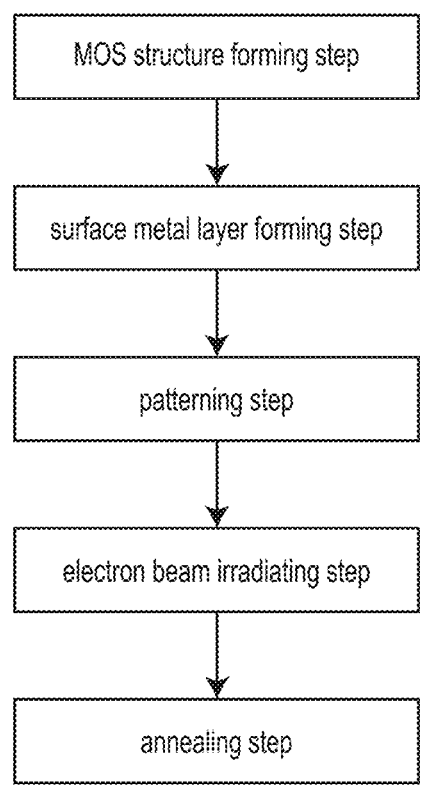
FIG. 17 is a flowchart for explaining a conventional method of manufacturing a semiconductor device.
Figures 18A, 18B:
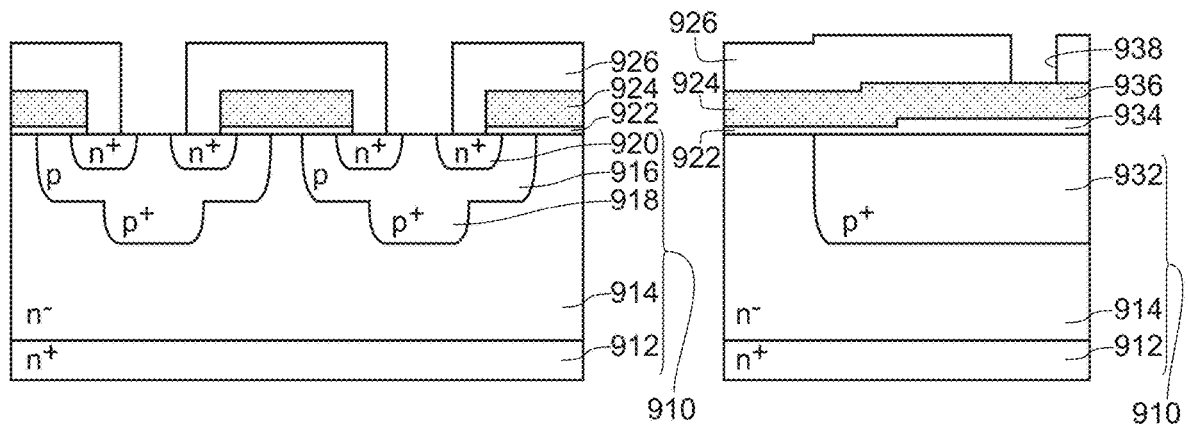
Figures 19A, 19B:
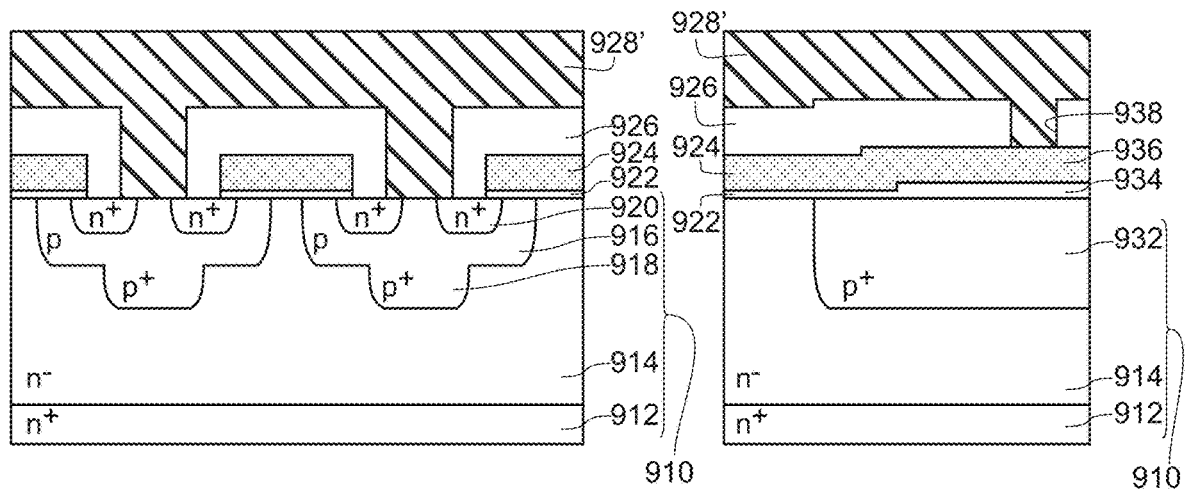
FIG. 19A and FIG. 19B are views for explaining a conventional surface metal layer forming step.
Figure 20A:
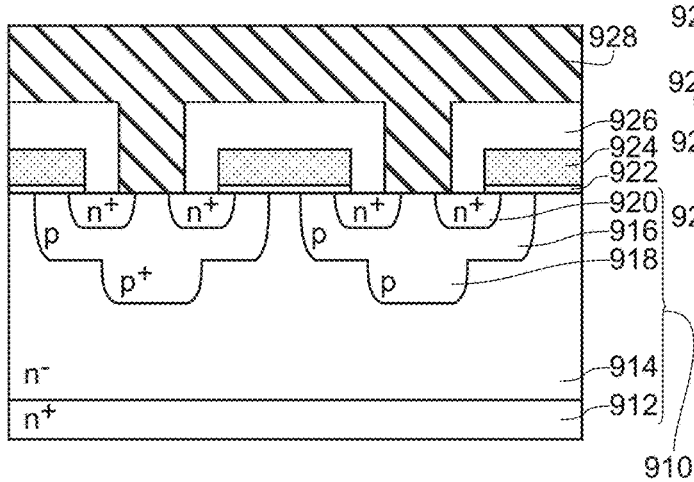
FIG. 20A and FIG. 20B are views for explaining a conventional patterning step. Symbol 940 indicates a gate line.
Figure 20B:
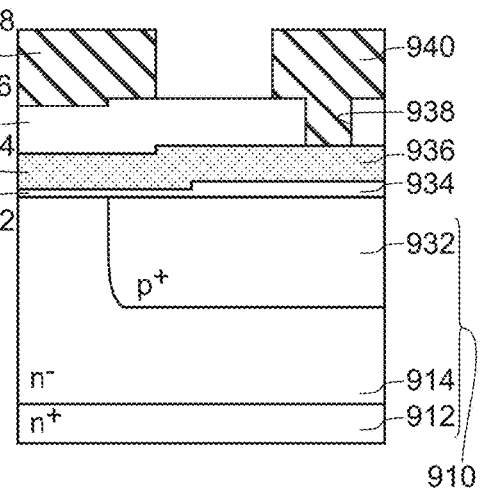
Figure 21A:
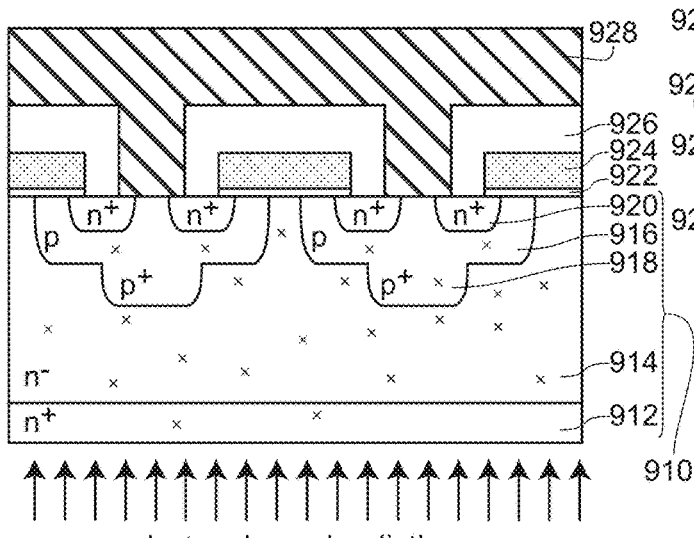
FIG. 21A and FIG. 21B are views for explaining a conventional electron beam irradiating step.
Figure 21B:
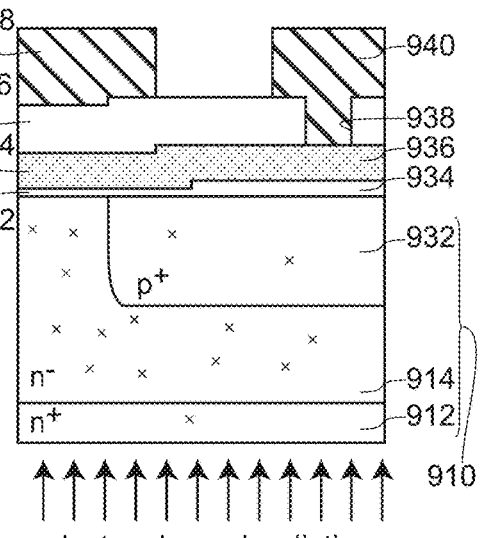

(6) In the above-mentioned respective embodiments, in the electron beam irradiating step, the semiconductor base substrate is placed on the tray made of a conductive material in a state where the first main surface of the semiconductor base substrate is directed upward and, thereafter, an electron beam is irradiated to the semiconductor base substrate in a state where the tray is grounded. However, the present invention is not limited to such a configuration. The semiconductor base substrate may be placed on the tray made of a conductive material in a state where the second main surface of the semiconductor base substrate is directed upward and, thereafter, an electron beam may be irradiated to the semiconductor base substrate in a state where the tray is grounded (see FIG. 16). In this case, it is preferable to form recessed portions 310 on a tray 302 so as to prevent the occurrence of a problem that regions which form semiconductor devices on the semiconductor base substrate (semiconductor wafer) are brought into contact with the tray so that scratches are formed on surfaces of surface metal layers of the semiconductor devices (and the semiconductor base substrate).

The invention claimed is:

1. A method of manufacturing a semiconductor device comprising in a following order:
   a MOS structure forming step where a gate electrode is formed on a first main surface side of a semiconductor base substrate with a gate insulation film interposed therebetween and, thereafter, an interlayer insulation film is formed so as to cover the gate electrode;
   a metal layer forming step where a metal layer in a state of being connected with the gate electrode is formed over the interlayer insulation film;
   an electron beam irradiating step where a lattice defect is formed in the inside of the semiconductor base substrate by irradiating an electron beam to the semiconductor base substrate from the first main surface side or a second main surface side in a state where the metal layer is set to a ground potential;
   a metal layer dividing step where the metal layer is divided into a plurality of electrodes; and
   an annealing step where the lattice defect in the semiconductor base substrate is repaired by heating the semiconductor base substrate.

2. The method of manufacturing a semiconductor device according to claim 1, wherein in the electron beam irradiating step, the semiconductor base substrate is placed on a tray made of a conductive material in a state where the first main surface side or the second main surface side of the semiconductor base substrate is directed upward and, thereafter, the electron beam is irradiated to the semiconductor base substrate in a state where the tray is grounded.

3. The method of manufacturing a semiconductor device according to claim 1, further comprising a sintering step where an ohmic junction is formed between the semiconductor base substrate and the metal layer by heating the semiconductor base substrate and the metal layer, the sintering step being performed between the metal layer forming step and the electron beam irradiating step.

4. The method of manufacturing a semiconductor device according to claim 1, wherein in the annealing step, a temperature at which the semiconductor base substrate is heated falls within a range of from 300° C. to 410° C.

5. The method of manufacturing a semiconductor device according to claim 1, wherein the metal layer dividing step and the annealing step are performed in a state where a temperature of the semiconductor base substrate is 410° C. or below.

6. The method of manufacturing a semiconductor device according to claim 1, further comprising a surface protective film forming step for forming a surface protective film on a surface of the semiconductor base substrate in a latter stage of the electron beam irradiating step.

7. The method of manufacturing a semiconductor device according to claim 6, wherein the surface protective film forming step is performed in a state where a temperature of the semiconductor base substrate is 410° C. or below.

8. The method of manufacturing a semiconductor device according to claim 6, further comprising a back surface metal layer forming step for forming a back surface metal layer on a second main surface side of the semiconductor base substrate in a latter stage of the surface protective film forming step, wherein
   the back surface metal layer forming step is performed in a state where a temperature of the semiconductor base substrate is 410° C. or below.

* * * * *